US012745398B2

(12) United States Patent
Kashiyama et al.

(10) Patent No.: US 12,745,398 B2
(45) Date of Patent: Sep. 22, 2026

(54) SEMICONDUCTOR MEMORY DEVICE AND METHOD OF MANUFACTURING THE SAME

(71) Applicant: Kioxia Corporation, Tokyo (JP)

(72) Inventors: Shota Kashiyama, Mie Mie (JP); Koichi Sakata, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 366 days.

(21) Appl. No.: 18/602,979

(22) Filed: Mar. 12, 2024

(65) Prior Publication Data

US 2025/0107085 A1 Mar. 27, 2025

(30) Foreign Application Priority Data

Sep. 21, 2023 (JP) ................................ 2023-155519

(51) Int. Cl.

| | |
|---|---|
| ***H10B 43/27*** | (2023.01) |
| ***G11C 16/04*** | (2006.01) |
| ***H10B 43/10*** | (2023.01) |
| ***H10B 43/35*** | (2023.01) |
| ***H10W 20/41*** | (2026.01) |

(52) U.S. Cl.

CPC ......... *H10B 43/27* (2023.02); *G11C 16/0483* (2013.01); *H10B 43/10* (2023.02); *H10B 43/35* (2023.02); *H10W 20/435* (2026.01)

(58) Field of Classification Search

CPC ........ H10B 43/27; H10B 43/10; H10B 43/35; H10B 43/50; G11C 16/0483; H10W 20/435

See application file for complete search history.

(56) References Cited

U.S. PATENT DOCUMENTS

| | | | | |
|---|---|---|---|---|
| 9,224,788 | B2 * | 12/2015 | Kobayashi | H10N 70/8845 |
| 11,404,430 | B2 * | 8/2022 | Komiya | H10B 43/27 |
| 11,825,653 | B2 * | 11/2023 | Lue | H10D 30/696 |
| 11,881,268 | B2 * | 1/2024 | Lee | G11C 16/16 |
| 12,199,032 | B2 * | 1/2025 | Kato | H10B 43/10 |
| 2017/0069655 | A1 * | 3/2017 | Ichinose | H10B 43/27 |
| 2020/0013796 | A1 * | 1/2020 | Fujita | H10B 43/27 |
| 2020/0083243 | A1 * | 3/2020 | Fukushima | H10B 43/40 |
| 2021/0296236 | A1 * | 9/2021 | Shirai | H10B 41/10 |

(Continued)

FOREIGN PATENT DOCUMENTS

| | | | |
|---|---|---|---|
| JP | 2023025878 | A | 2/2023 |
| TW | 202337008 | A | 9/2023 |

*Primary Examiner* — Mamadou L Diallo

(74) *Attorney, Agent, or Firm* — Holtz, Holtz & Volek PC

(57) ABSTRACT

First conductors and first insulators are alternately arranged one by one in a first direction in a first region. The first insulators and second insulators are alternately arranged one by one in the first direction in a second region. The memory pillar penetrates the first conductors and the first insulators in the first region and includes a semiconductor. A second conductor includes first to third portions. The second portion electrically couples the first portion and the third portion. A side surface of the third portion is electrically coupled to the semiconductor. A first film extends along the first direction in the second region. A second film contacts the first film, extends along the first direction, and includes carbon or metal. One of the second insulators includes a portion extending along the first and second films in the second region and being distanced from the second film.

20 Claims, 27 Drawing Sheets

(56) References Cited

U.S. PATENT DOCUMENTS

| | | | | |
|---|---|---|---|---|
| 2023/0047644 | A1 | 2/2023 | Kashiyama et al. | |
| 2023/0109723 | A1 * | 4/2023 | Wu | H10B 41/10 257/314 |
| 2023/0255029 | A1 * | 8/2023 | Hamanaka | H10B 41/27 257/316 |
| 2023/0292519 | A1 | 9/2023 | Kutsukake | |
| 2024/0284674 | A1 * | 8/2024 | Yamazaki | H10B 43/10 |
| 2025/0234620 | A1 * | 7/2025 | Kajino | H10B 43/35 |
| 2025/0275174 | A1 * | 8/2025 | Miyairi | H10B 12/00 |
| 2026/0006767 | A1 * | 1/2026 | Kimura | H10B 12/00 |

* cited by examiner

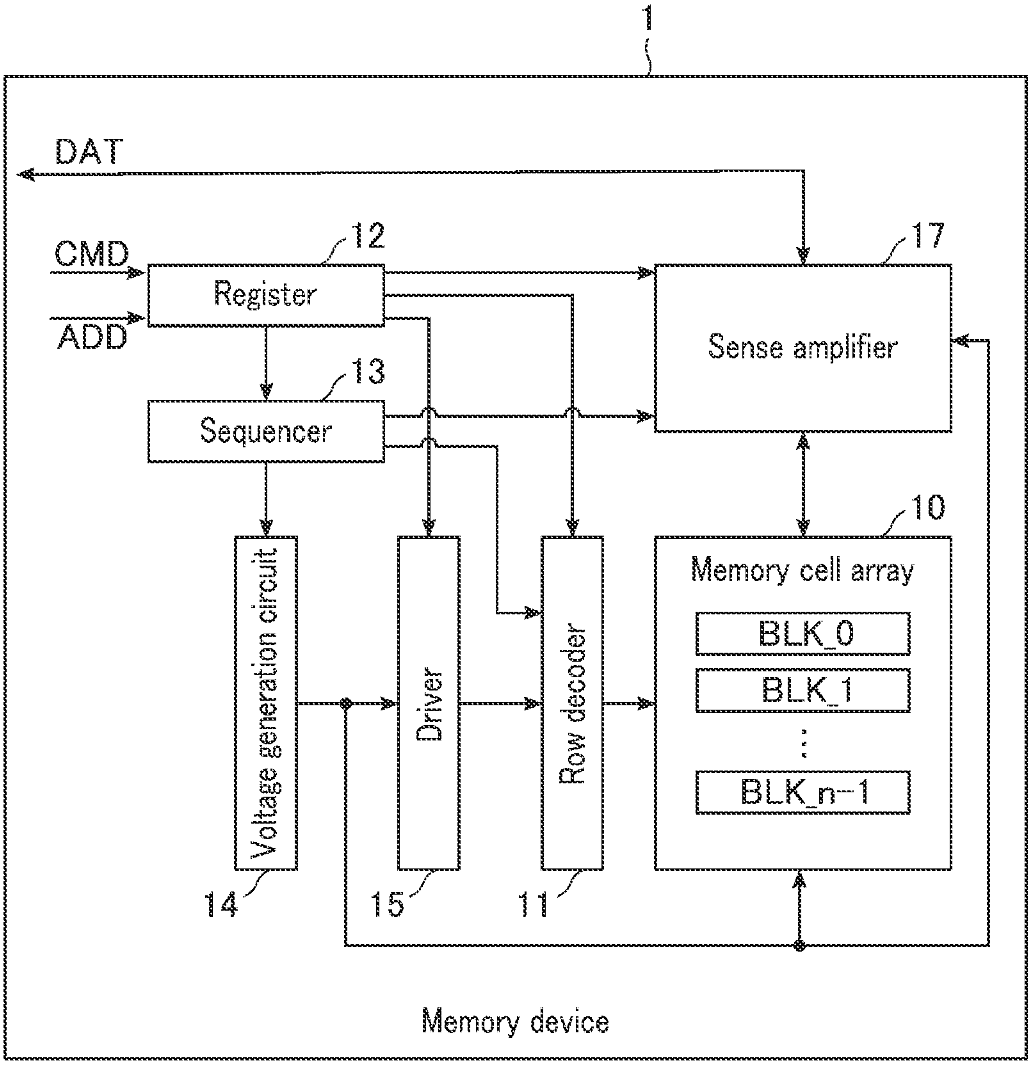
F I G. 1

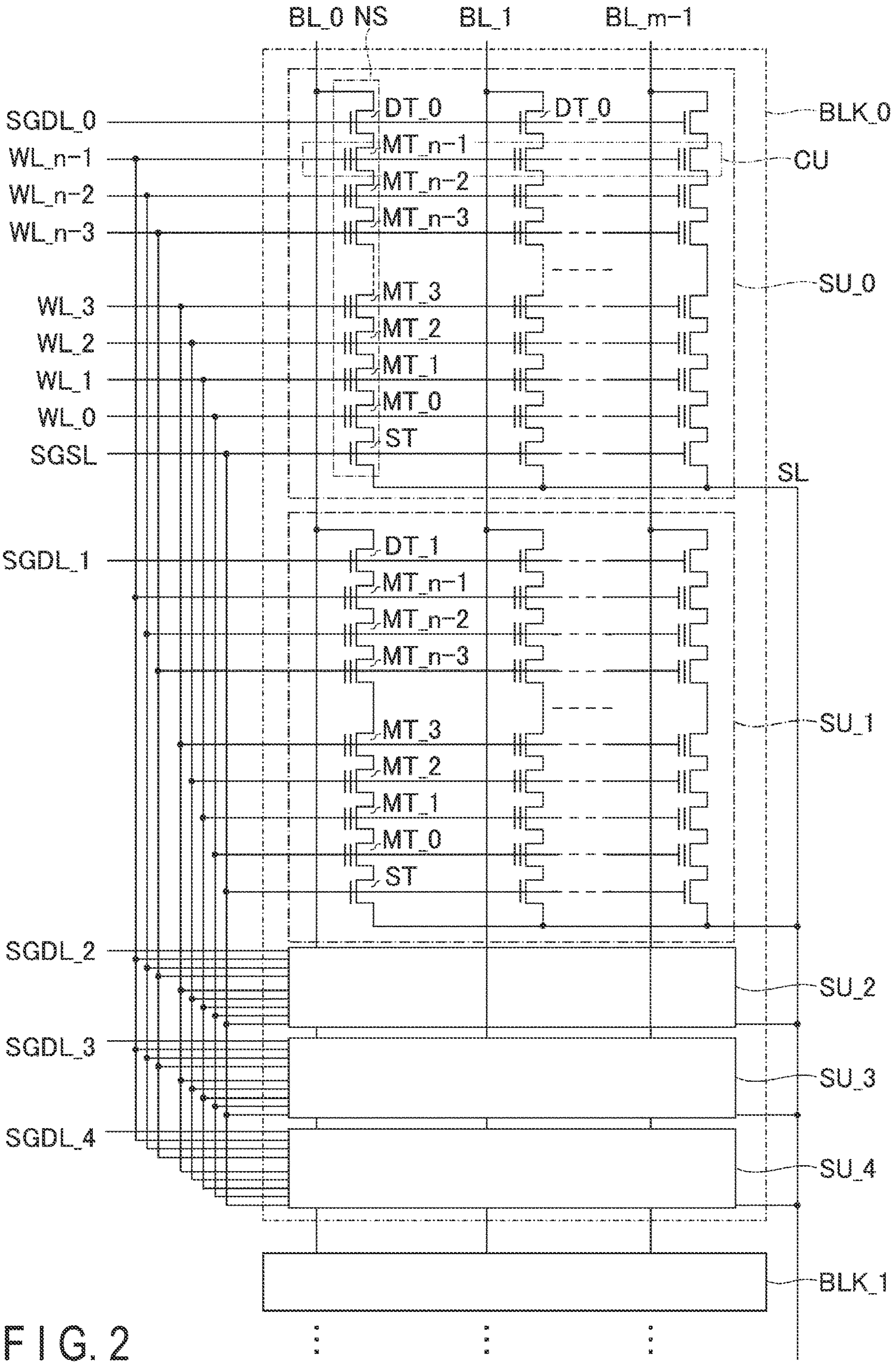
F I G. 2

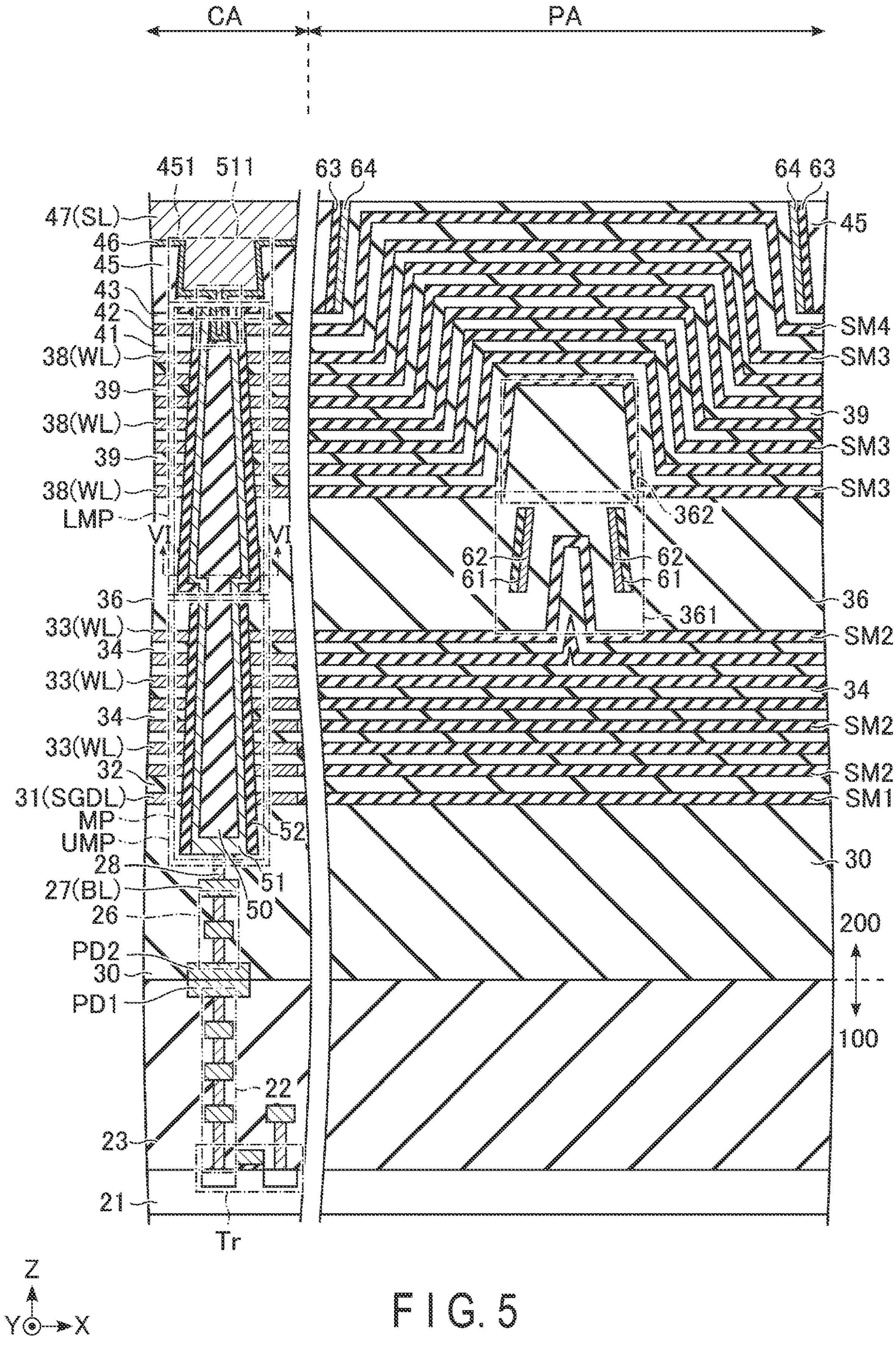
F I G. 5

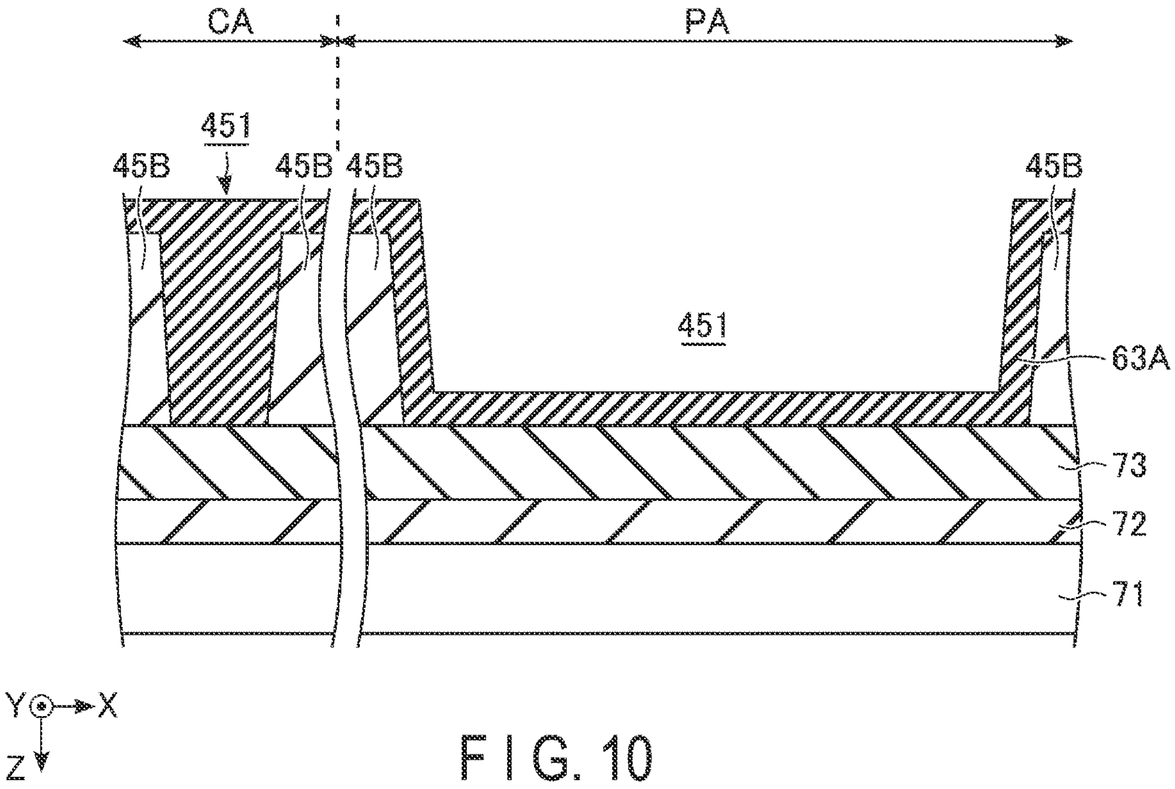
F I G. 10
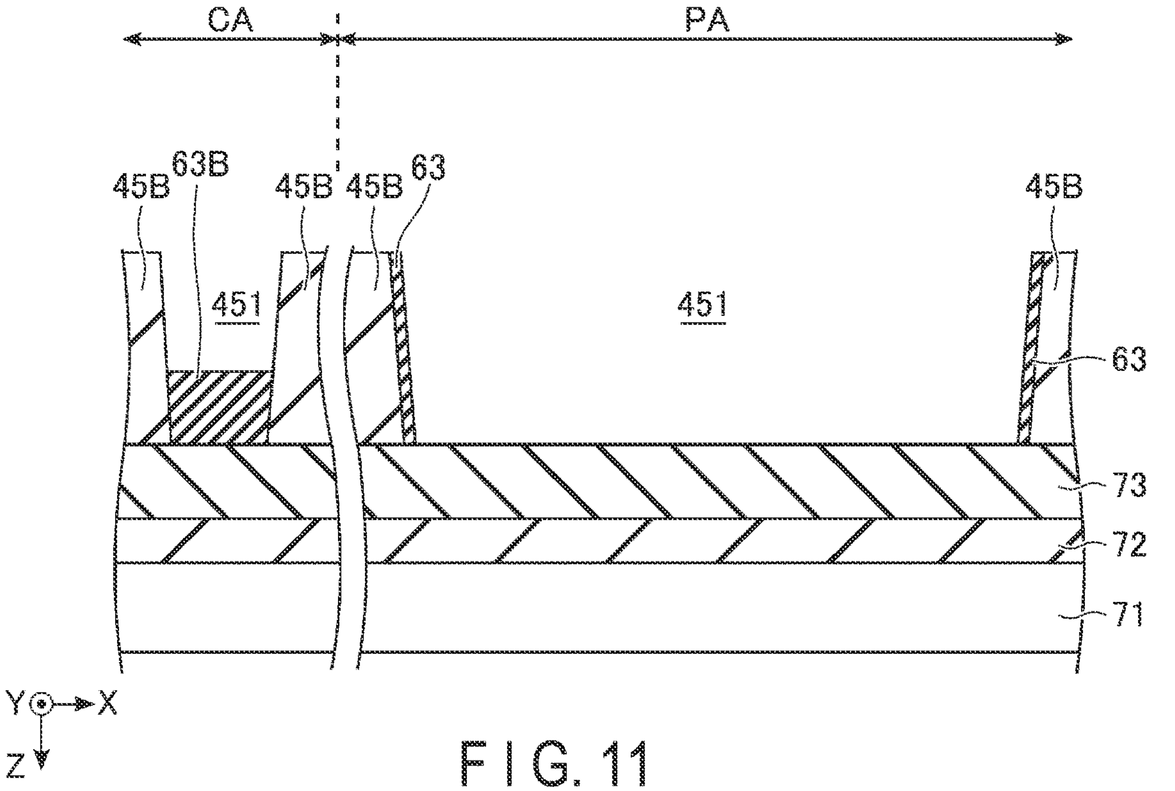
F I G. 11

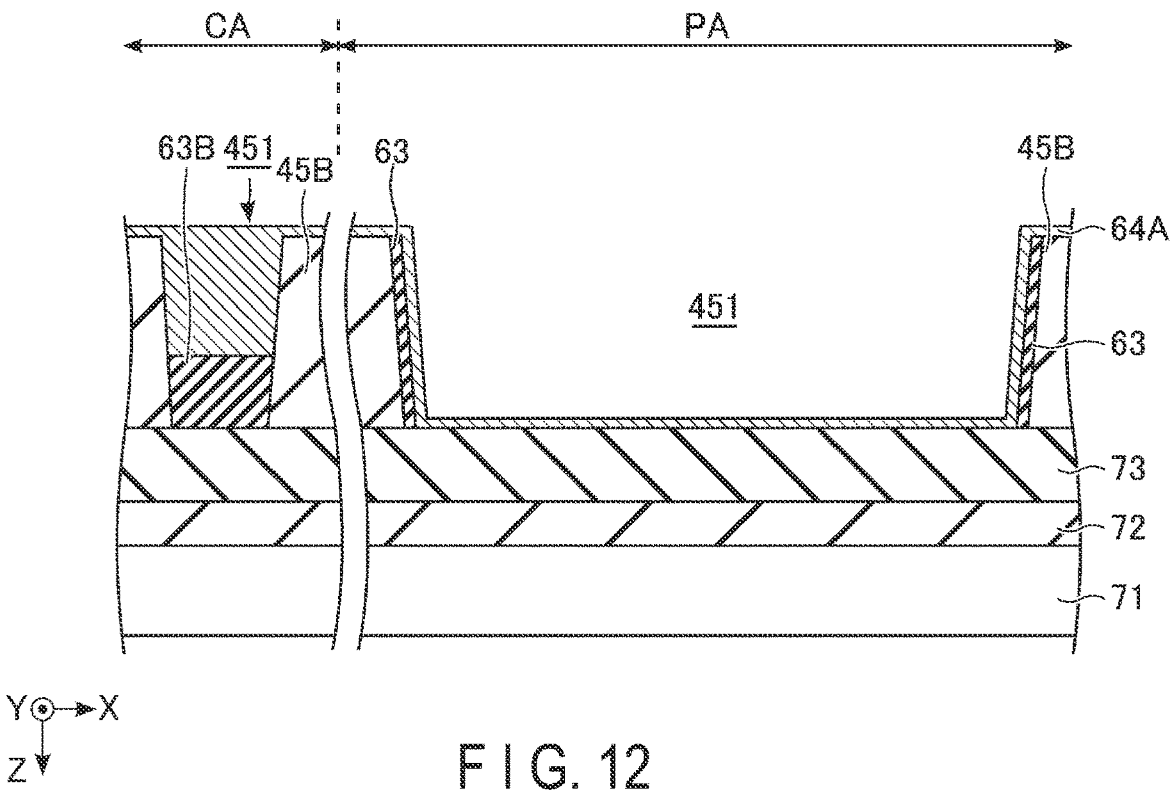
F I G. 12
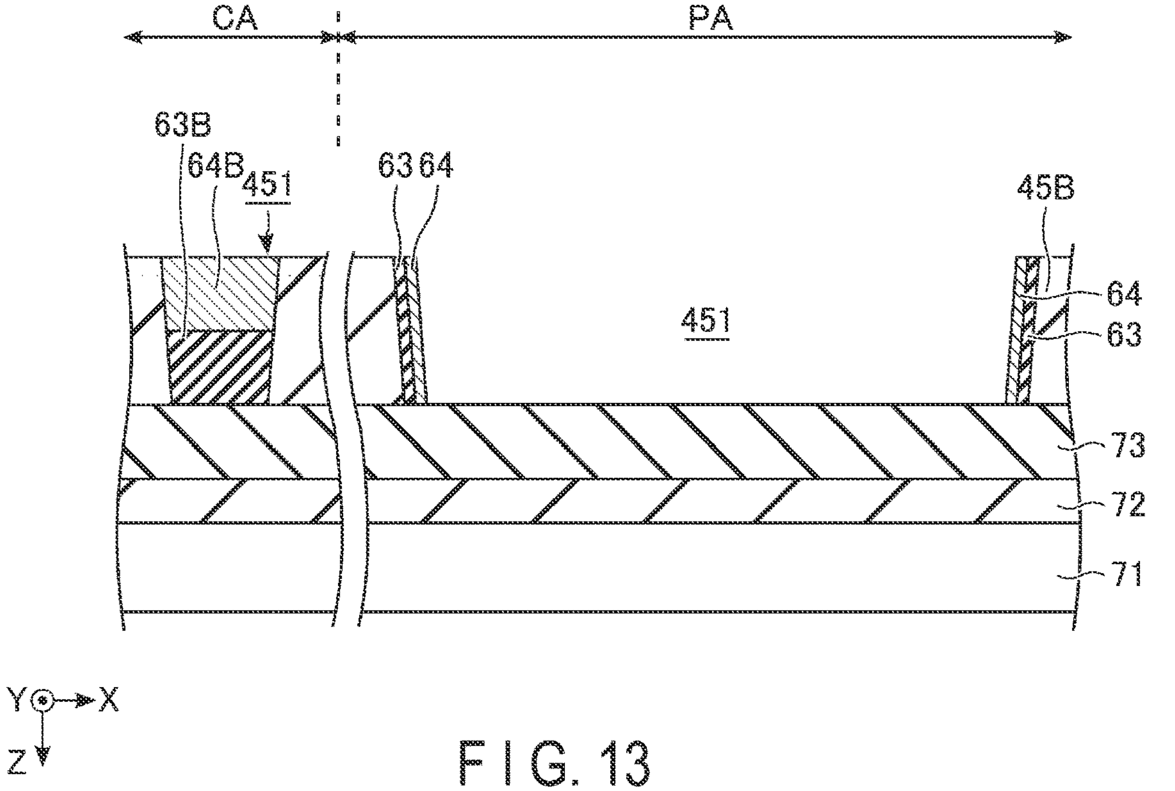
F I G. 13

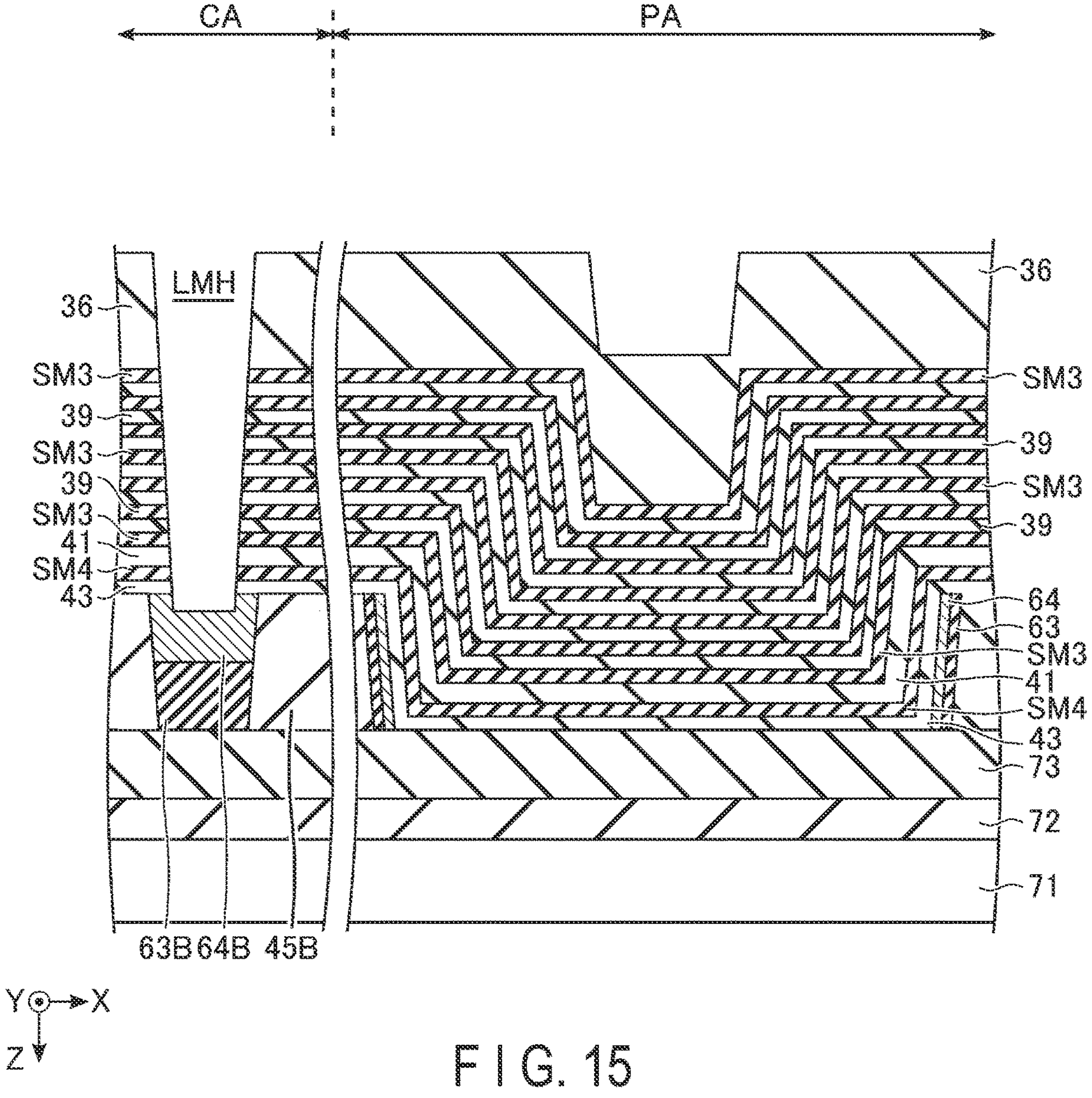
F I G. 15

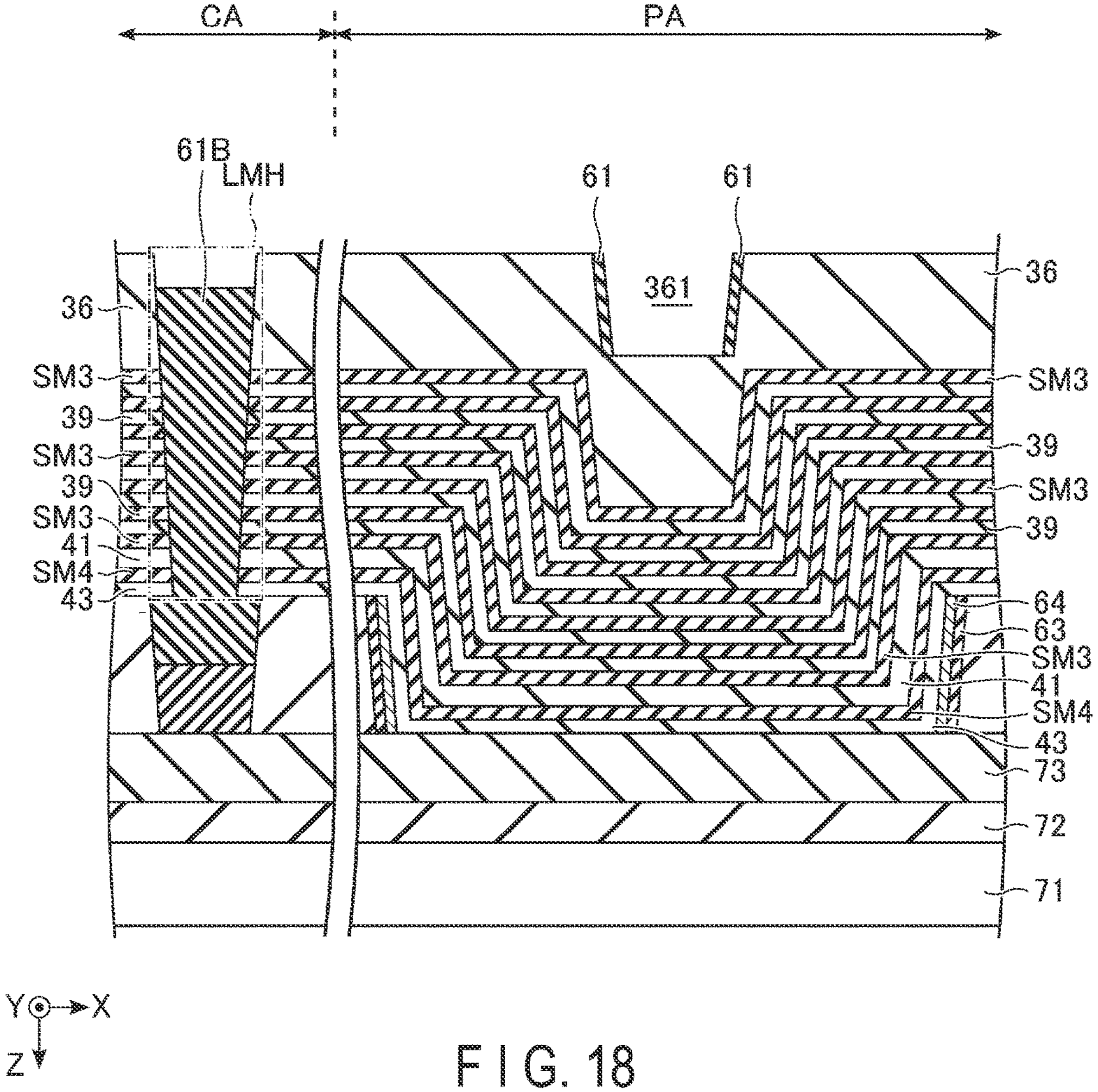
F I G. 18

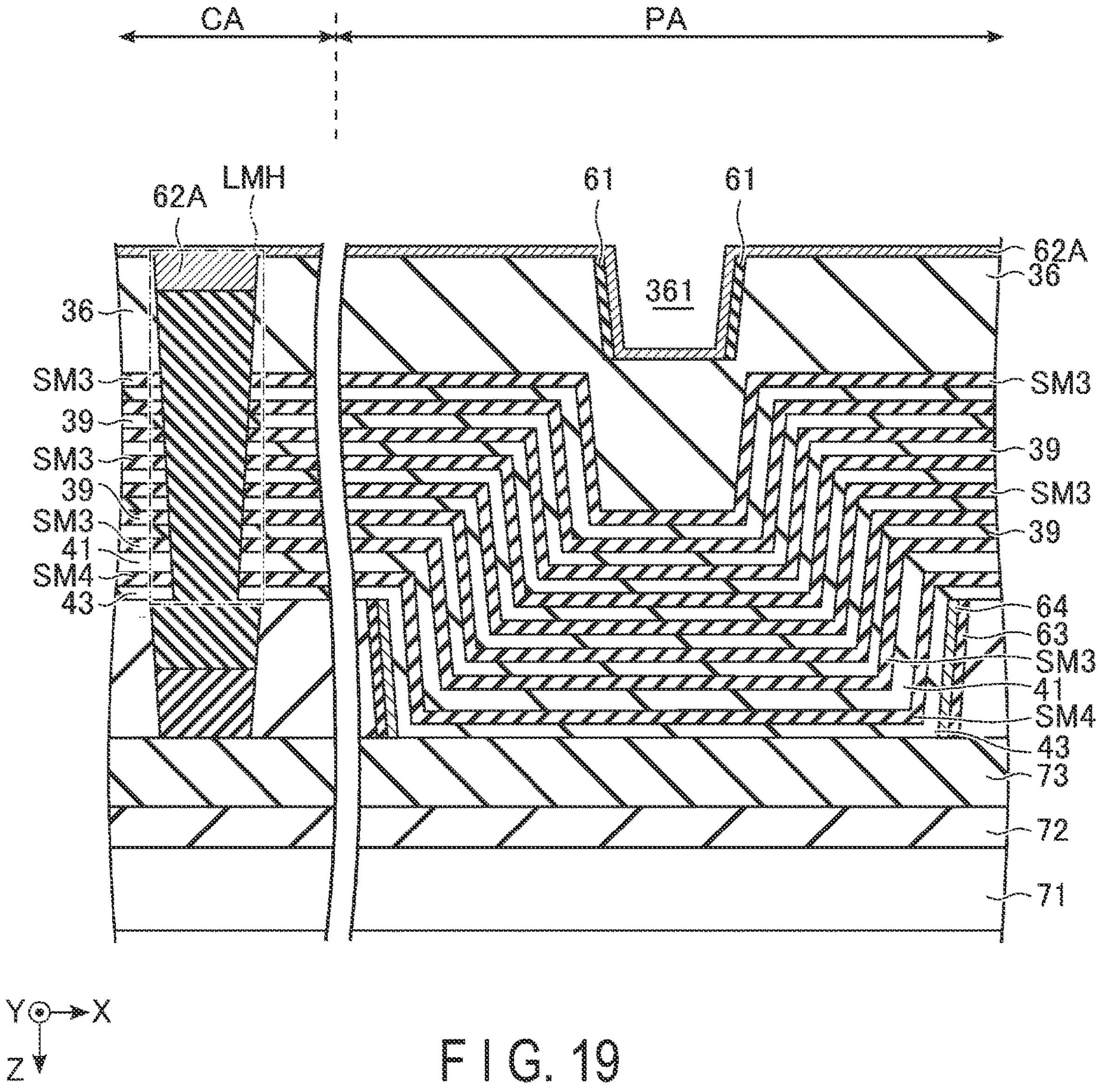
F I G. 19

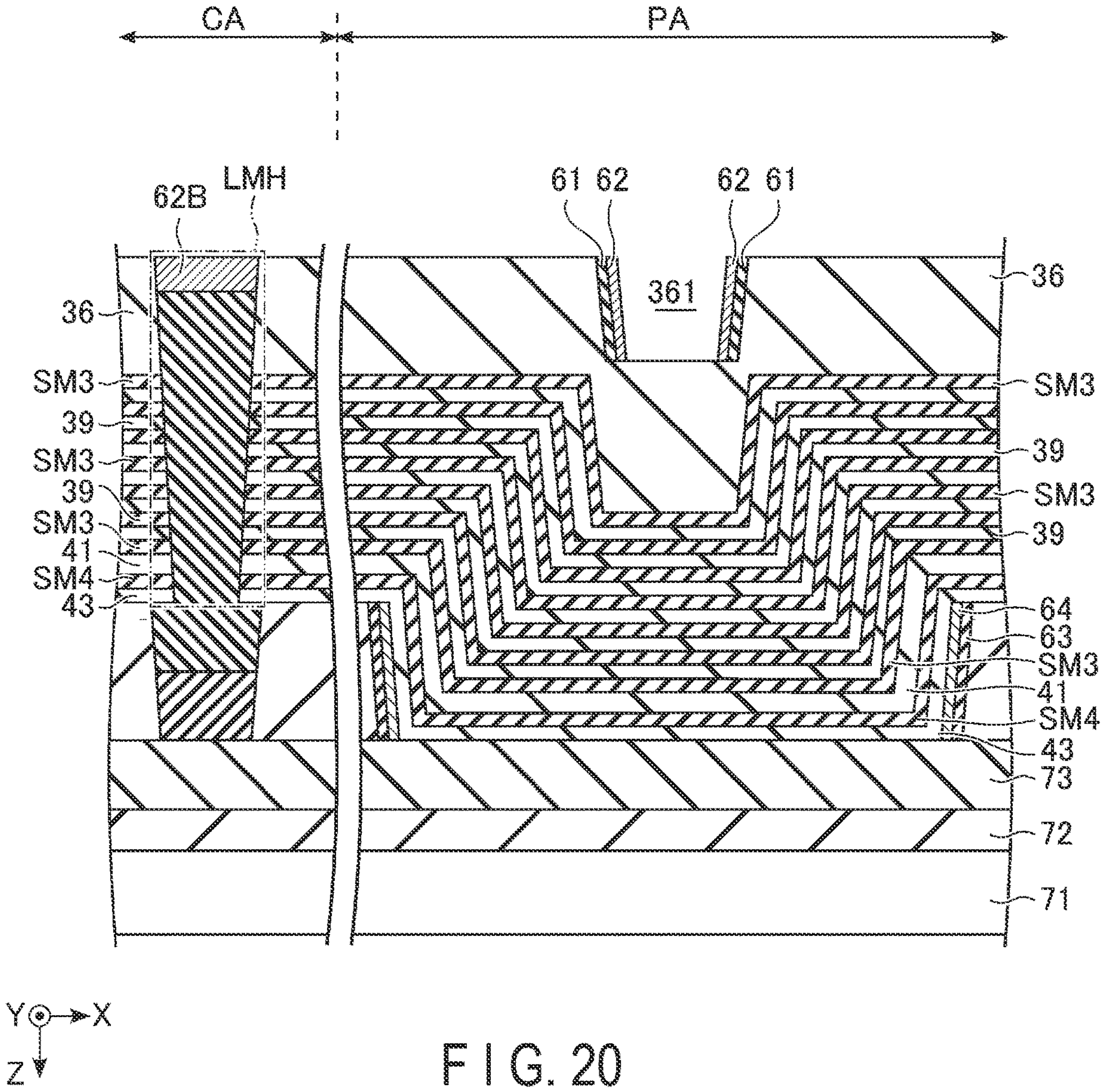
F I G. 20

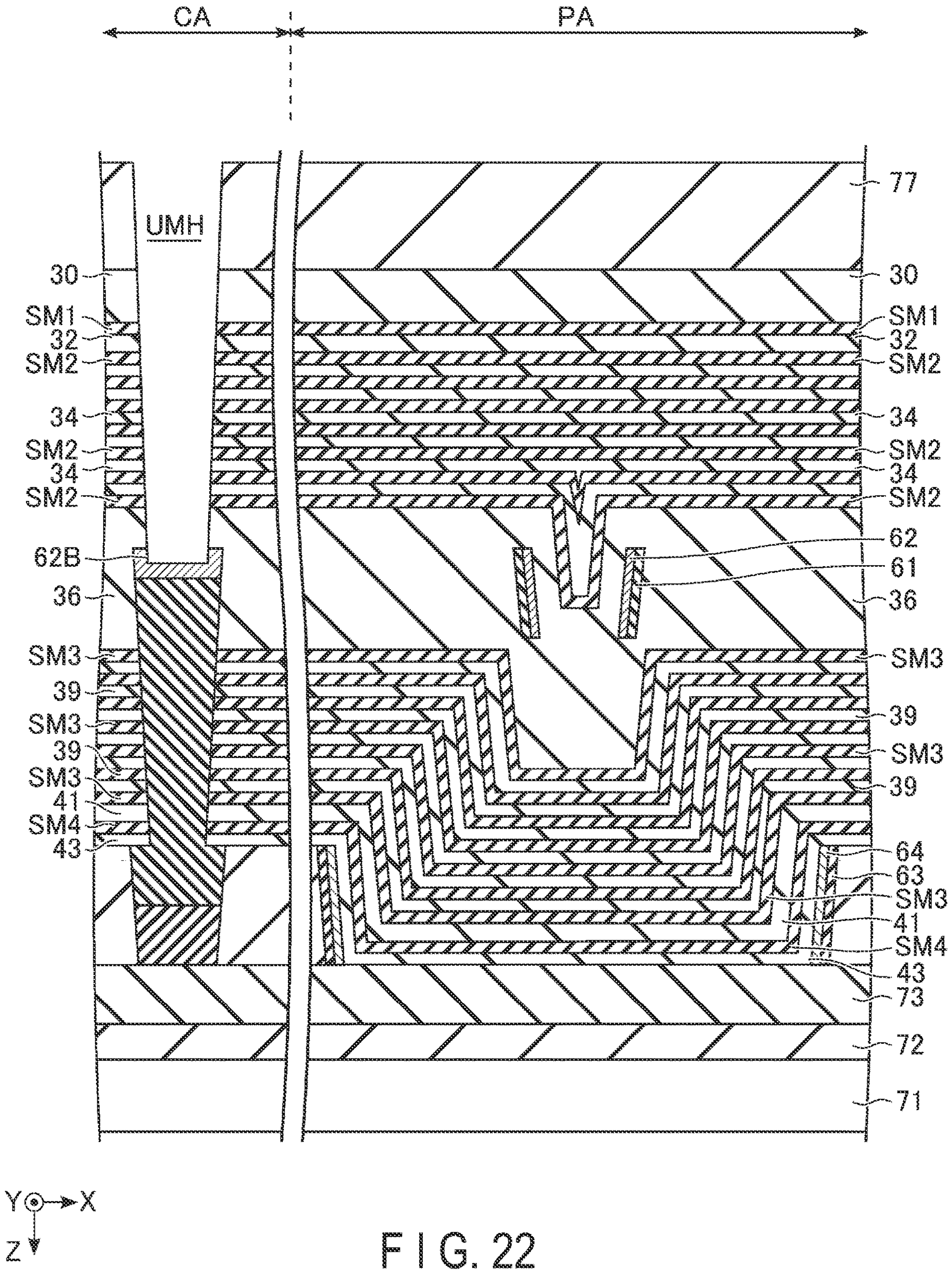
F I G. 22

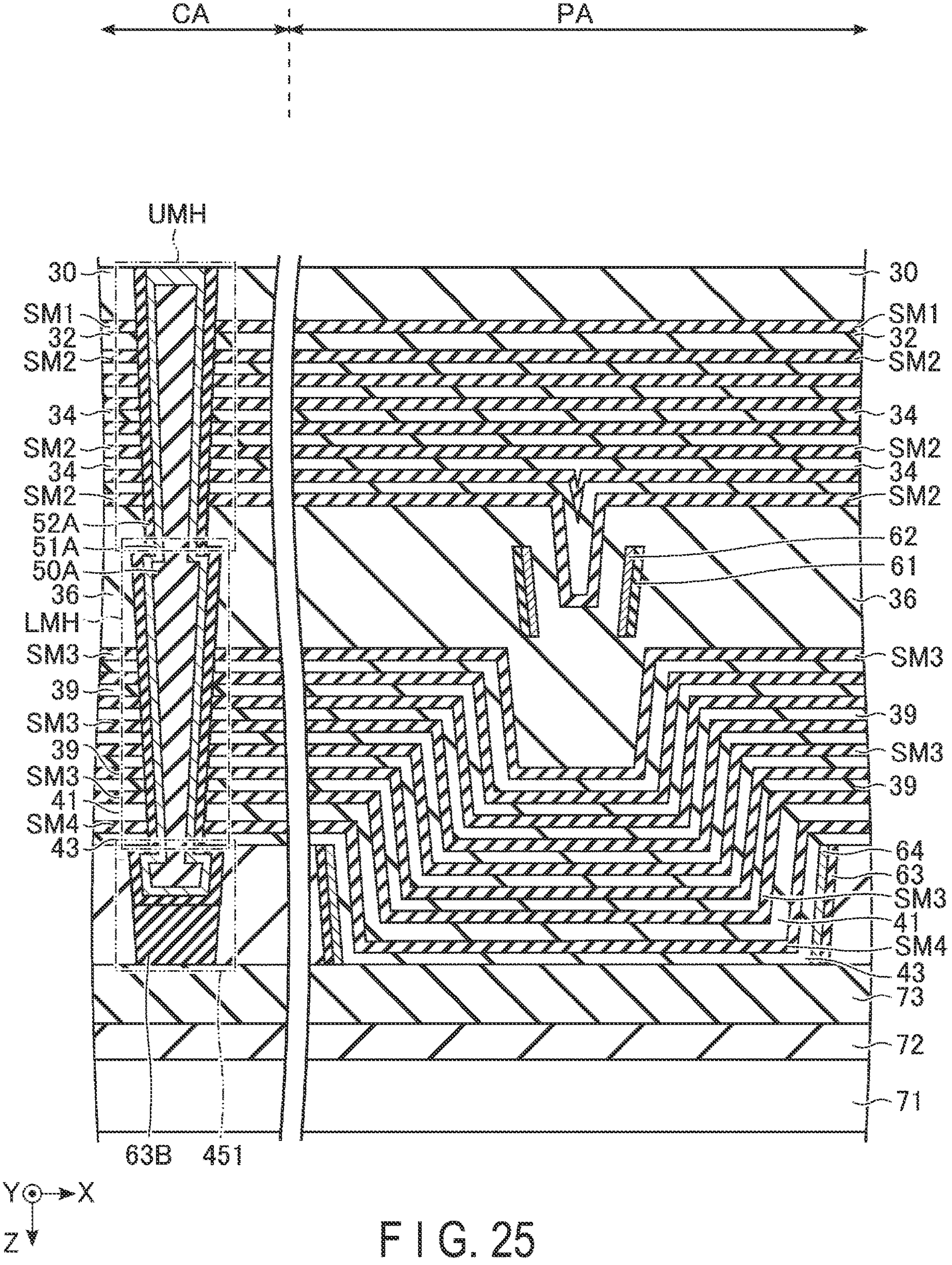
F I G. 25

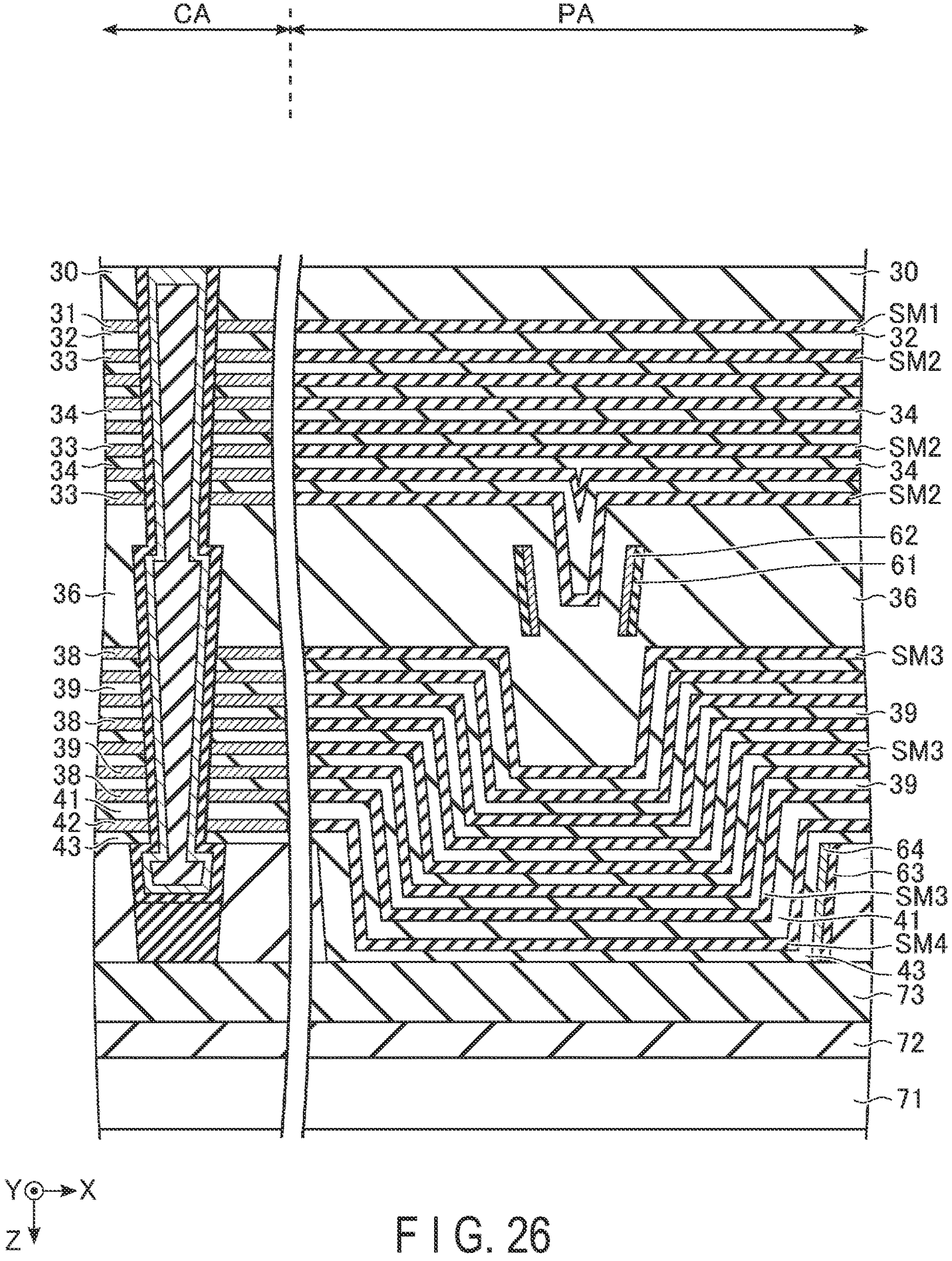
F I G. 26

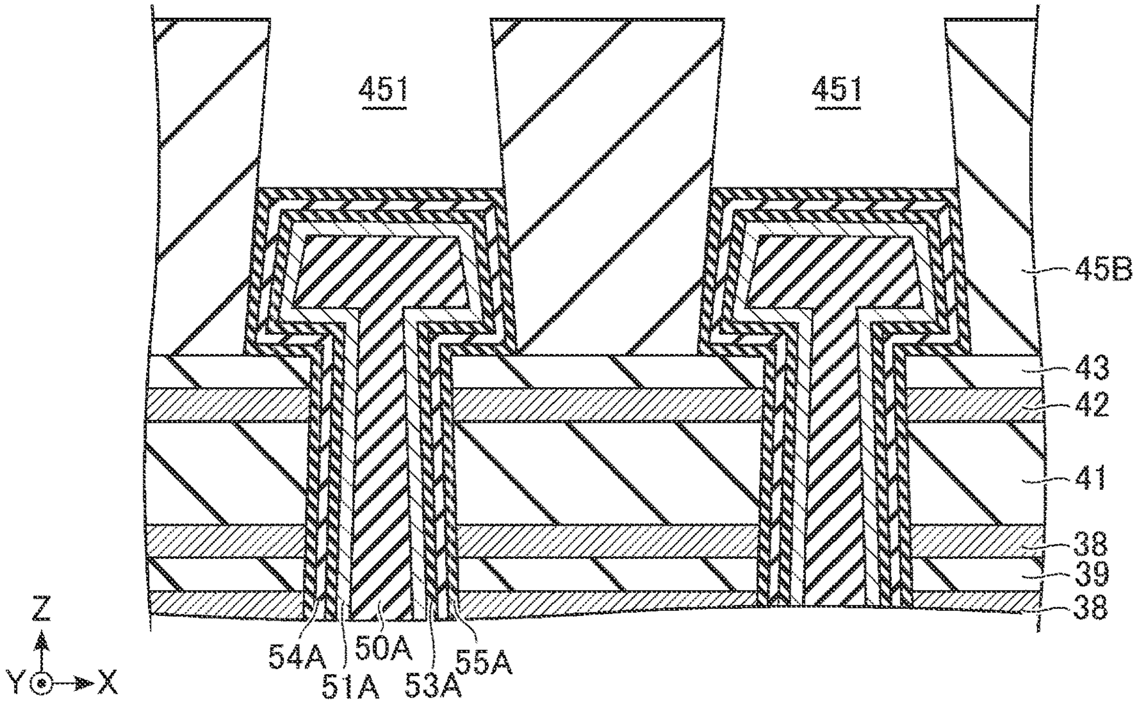
F I G. 28
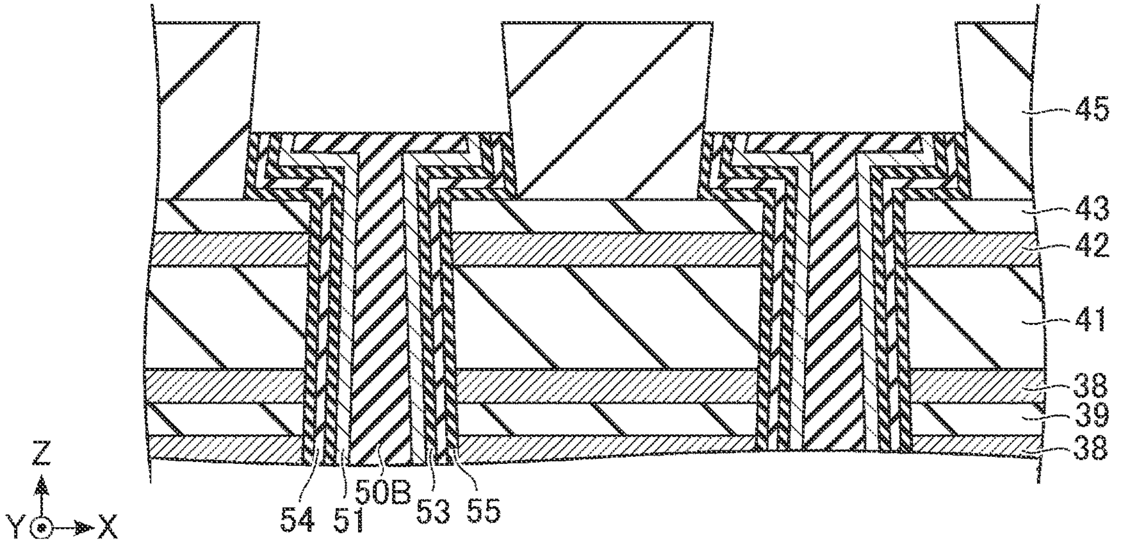
F I G. 29

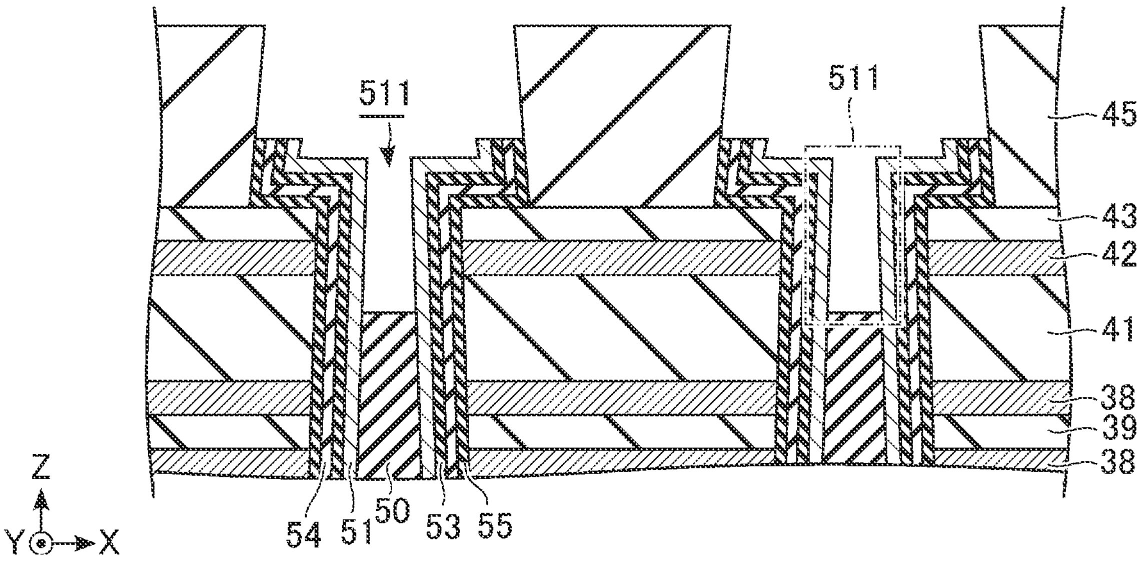
F I G. 30

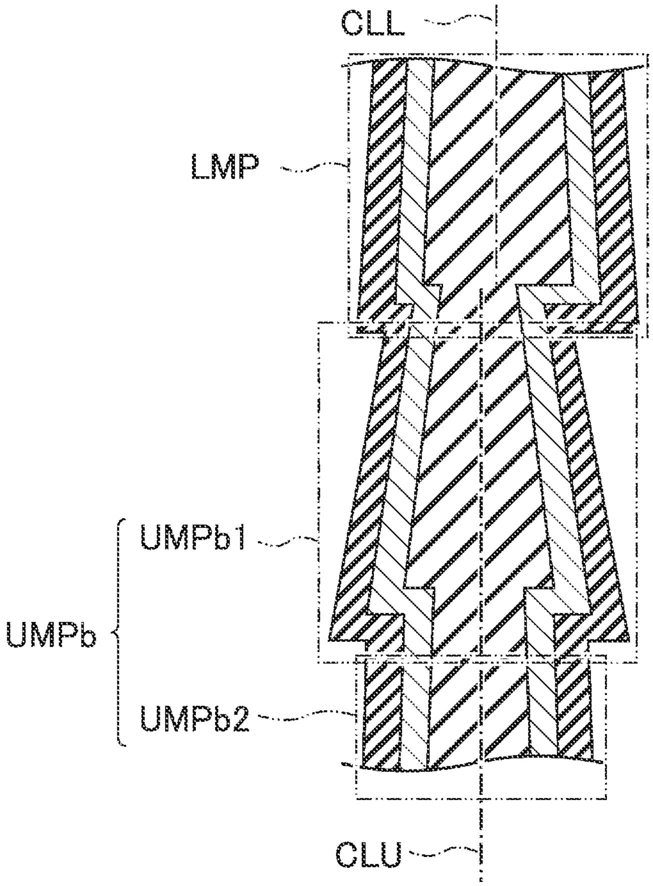
F I G. 32

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2023-155519, filed Sep. 21, 2023, the entire contents of which are incorporated herein by reference.

FIELD

Embodiments described herein relate generally to a semiconductor memory device and a method of manufacturing the same.

BACKGROUND

A memory device in which memory cells are three-dimensionally disposed is known. For improvement in the storage capacity of the memory device, miniaturization of components of the memory device has been advanced.

BRIEF DESCRIPTION OF THE DRAWINGS

FIG. 1 shows an example of components of a memory device according to a first embodiment and how they are coupled.

FIG. 2 shows components of a single block of the memory device according to the first embodiment and how they are coupled.

FIG. 5 schematically shows an example of a cross-sectional structure of a part of the memory device according to the first embodiment.

Each of FIGS. 8 to 30 shows an example of a cross-sectional structure of a part of the memory device during manufacturing according to the first embodiment.

Figure 31:
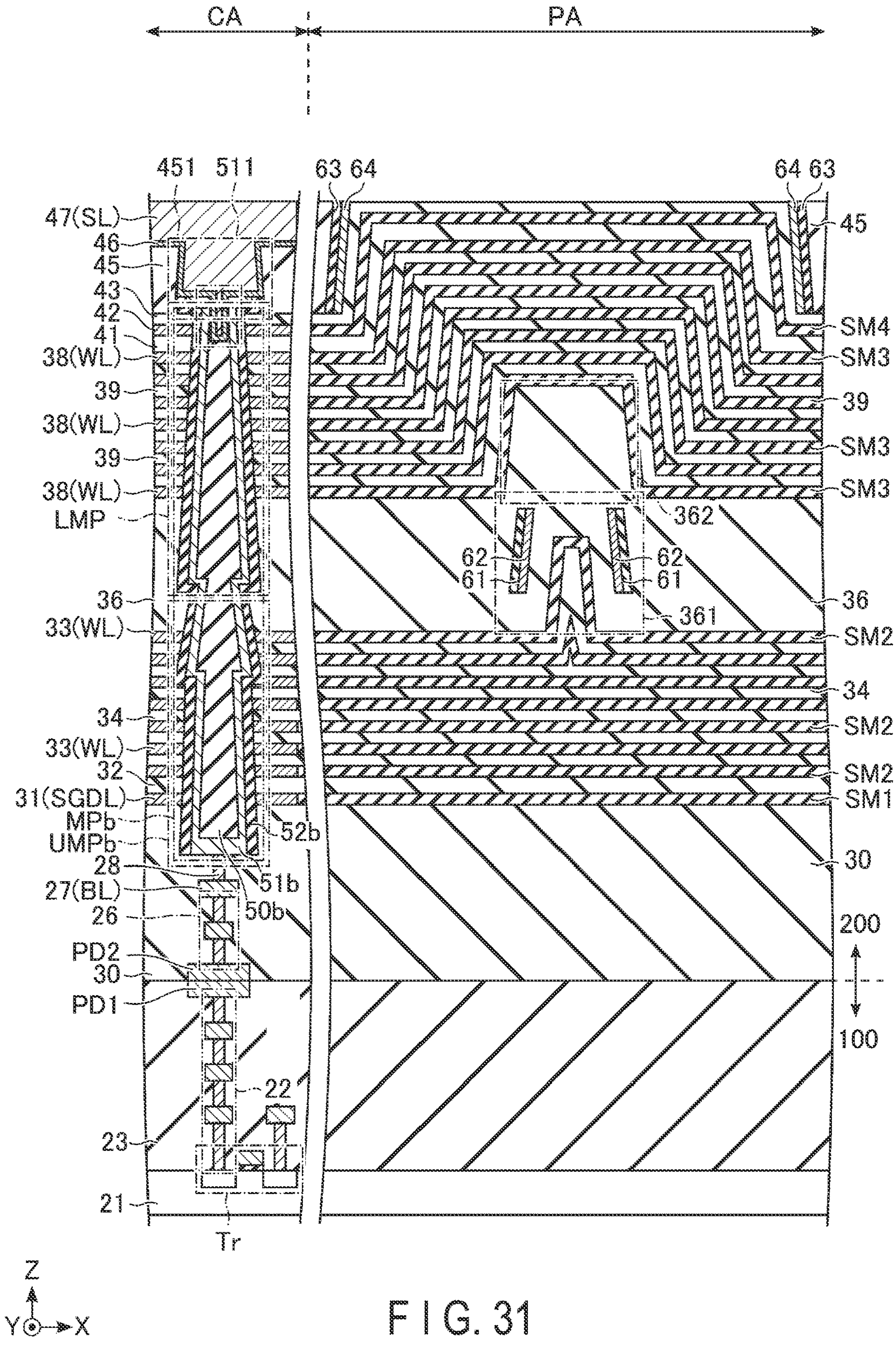

FIG. 31 schematically shows an example of a cross-sectional structure of a part of a memory device according to a second embodiment.

FIG. 32 shows an example of a cross-sectional structure of a part of the memory device according to the second embodiment.

Figure 33:
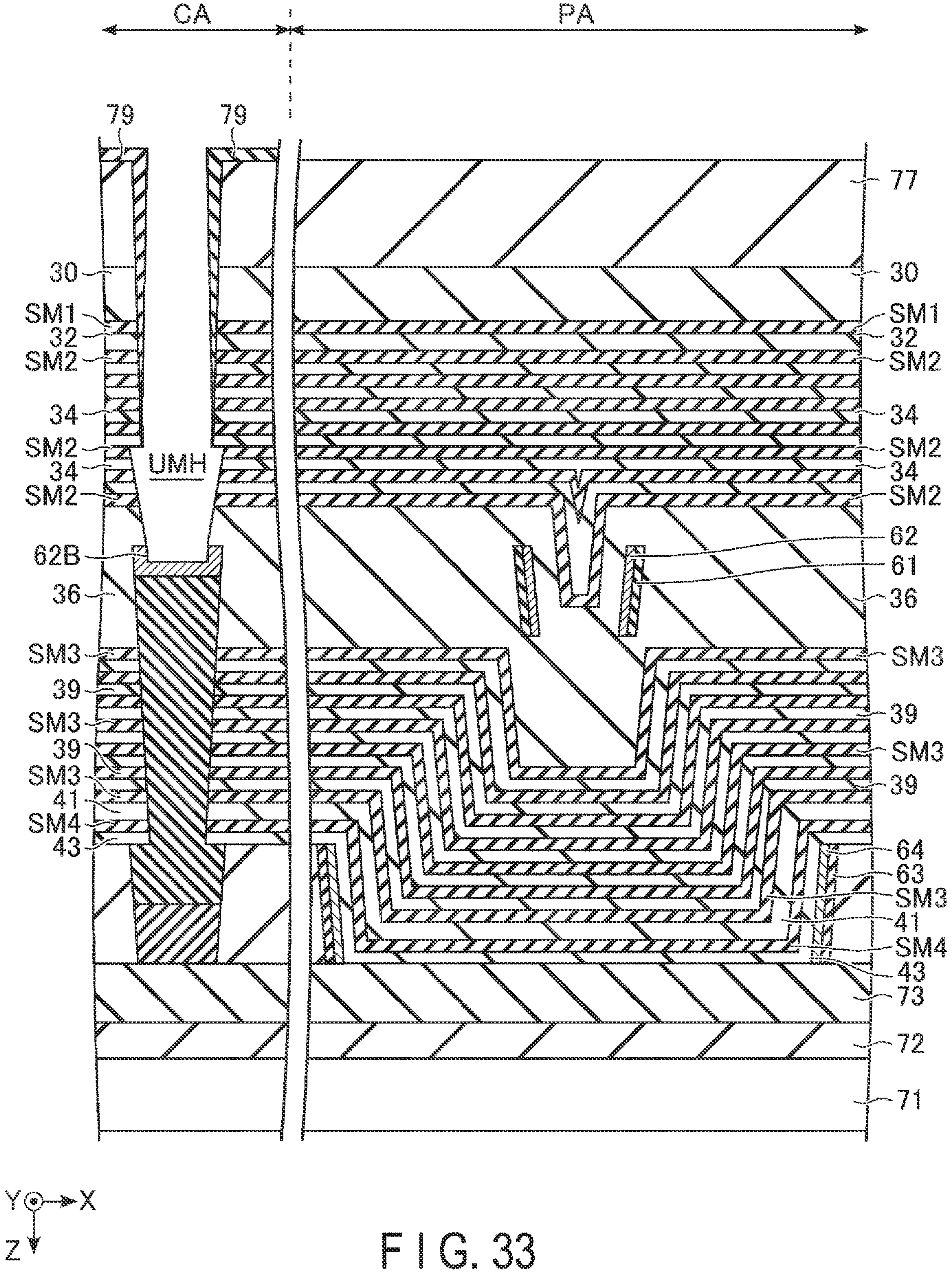

FIG. 33 shows an example of a cross-sectional structure of a part of the memory device during manufacturing according to the second embodiment.

DETAILED DESCRIPTION

In general, according to one embodiment, a semiconductor memory device includes a plurality of first conductors; a plurality of first insulators; a plurality of second insulators; a memory pillar; a second conductor; a first film; and a second film. The first conductors and the first insulators are arranged one by one in an alternating manner in a first direction in a first region. The first insulators and the second insulators are arranged one by one in an alternating manner in the first direction in a second region. The memory pillar penetrates the first conductors and the first insulators in the first region and includes a semiconductor and a film surrounding a side surface of the semiconductor. The second conductor includes a first portion, a second portion, and a third portion. The second portion electrically couples the first portion and the third portion. A side surface of the third portion is electrically coupled to the semiconductor. The first film extends along the first direction in the second region and has an angle with respect to the first direction. The second film contacts the first film, extends along the first direction, has an angle with respect to the first direction, and includes carbon or metal. At least one of the second insulators includes a portion extending along the first film and the second film in the second region and being distanced from the second film.

Embodiments will now be described with reference to the figures. In order to distinguish components having substantially the same function and configuration in an embodiment or over different embodiments from each other, an additional numeral or letter may be added to the end of each reference numeral or letter. For an embodiment subsequent to an embodiment that has already been described, the description will concentrate mainly on the matters that constitute a difference from the already described embodiment. The entire description of a particular embodiment applies to another embodiment unless an explicit mention is made otherwise, or an obvious elimination is involved.

The figures are schematic, and the relation between the thickness and the area of a plane of a layer and the ratio of thicknesses of layers may differ from those in actuality. The figures may include components which differ in relations and/or ratios of dimensions in different figures.

1. First Embodiment

1.1. Configuration (Structure)

FIG. 1 shows an example of components of a memory device according to a first embodiment and how they are coupled. A memory device 1 is a device that stores data using memory cells. The memory device (semiconductor memory device) 1 is controlled by an external memory controller. The memory device 1 operates based on, for example, a command CMD and address information ADD received from the memory controller. The memory device 1 receives data DAT to be written, and outputs data stored in the memory device 1.

The memory device 1 includes components such as a memory cell array 10, a row decoder 11, a register 12, a sequencer 13, a voltage generator 14, a driver 15, and a sense amplifier 17.

The memory cell array 10 is a set of arrayed memory cells. The memory cell array 10 includes a plurality of memory blocks (blocks) BLK. Each block BLK includes a plurality of memory cell transistors MT (not illustrated). In the memory cell array 10, interconnects such as word lines WL (not illustrated) and bit lines BL (not illustrated) are also disposed.

The row decoder 11 is a circuit for selecting a block BLK. The row decoder 11 transfers a voltage supplied from the driver 15 to a single block BLK selected based on a block address received by the row decoder 11 from the register 12.

The register 12 is a circuit that holds the command CMD and the address information ADD received by the memory device 1. The command CMD instructs the sequencer 13 to perform various operations including data reading, data writing, and data erasing. The address information ADD designates an access target in the memory cell array 10.

The sequencer 13 is a circuit that controls the entire operation of the memory device 1. The sequencer 13 controls the row decoder 11, the driver 15, and the sense amplifier 17 based on the command CMD received from the sequencer 13 to perform various operations including data reading, data writing, and data erasing.

The voltage generator 14 is a circuit that generates voltages of different magnitudes. The voltage generator 14 receives a power-supply voltage from outside the memory device 1, and generates a plurality of voltages from the power-supply voltage. The voltage generator 14 supplies the generated voltages to components such as the memory cell array 10, the driver 15, and the sense amplifier 17.

The driver 15 is a circuit that applies various voltages necessary for operating the memory device 1 to some of the components. The driver 15 receives multiple voltages from the voltage generator 14, selects one or more of the voltages, and supplies the selected voltages to one or more row decoders 11.

The sense amplifier 17 is a circuit that outputs a signal based on data stored in the memory cell array 10. The sense amplifier 17 senses a state of each memory cell transistor MT, and generates read data based on the sensed state. The sense amplifier 17 applies a voltage based on write data to a bit line BL.

1.1.1. Memory Cell Array

FIG. 2 shows components of a single block of the memory device according to the first embodiment and how they are coupled. A plurality of blocks BLK, for example, all the blocks BLK, include components and couplings shown in FIG. 2.

A single block BLK includes a plurality of string units SU. FIG. 2 shows an example of five string units SU_0 to SU_4.

Each of m bit lines BL_0 to BL_m−1 is coupled to a single NAND string NS included in each of the string units SU_0 to SU_4 in each block BLK, as shown in FIG. 2. Here, m is a positive integer.

Each NAND string NS includes a single select gate transistor ST, n memory cell transistors MT (MT_0 to MT_n−1), and a single select gate transistor DT (DT0, DT1, DT2, DT3, or DT4). Here, n is a positive integer. The memory cell transistors MT are elements configured to store data in a non-volatile manner. Each memory cell transistor MT includes a control gate electrode or a gate electrode (word line WL) and a charge storage film insulated from the surroundings, and is configured to store data in a non-volatile manner based on a charge in the charge storage film. Through injection of electrons into the charge storage film, data is written into the memory cell transistor MT.

The select gate transistor ST, the memory cell transistors MT_0 to MT_n−1, and the select gate transistor DT are coupled in series in this order between the source line SL and a single bit line BL.

A plurality of NAND strings NS respectively coupled to different bit lines BL constitute a single string unit SU. In each string unit SU, control gate electrodes of the memory cell transistors MT_0 to MT_n−1 are respectively coupled to the word lines WL 0 to WL n−1. A group of memory cell transistors MT sharing a word line WL in a single string unit SU is referred to as a "cell unit CU".

The select gate transistors DT0 to DT4 respectively belong to the string units SU_0 to SU_4. In FIG. 2, illustration of the select gate transistors DT2, DT3, and DT4 is omitted. A gate of the select gate transistor DT0 of each of the plurality of NAND strings NS of the string unit SU_0 is coupled to a select gate line SGDL0. Similarly, gates of the select gate transistors DT1, DT2, DT3, and DT4 of the plurality of NAND strings NS of the string units SU_1, SU_2, SU_3, and SU_4 are respectively coupled to select gate lines SGDL1, SGDL2, SGDL3, and SGDL4.

A gate of the select gate transistor ST is coupled to a select gate line SGSL.

1.1.2. Basic Structure of Memory Device

Figure 3:
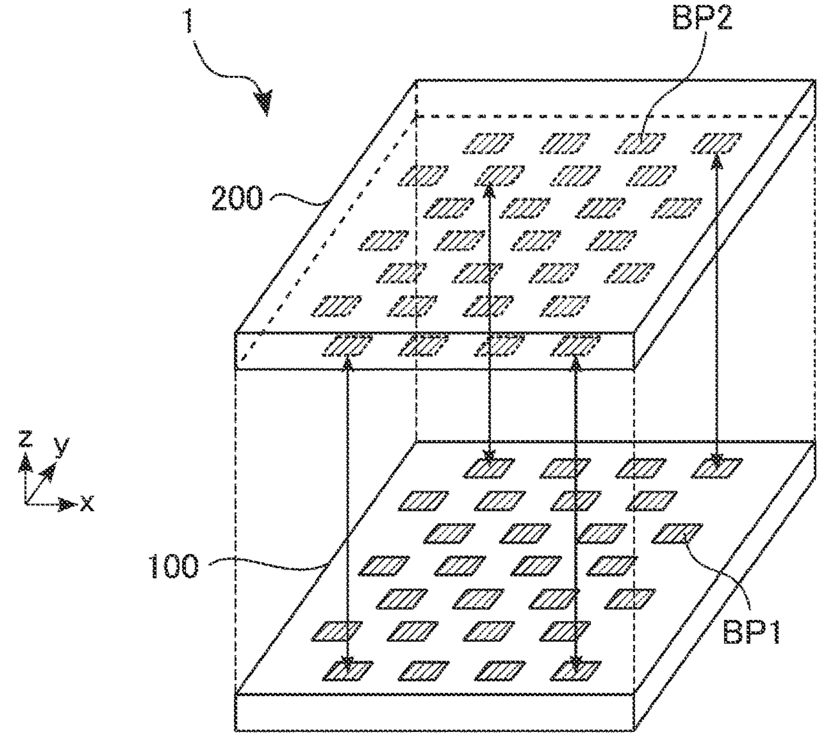
FIG. 3 schematically shows a basic structure of the memory device according to the first embodiment.

FIG. 3 schematically shows a basic structure of the memory device according to the first embodiment. As shown in FIG. 3, the memory device 1 includes a first structure 100 and a second structure 200 arranged along a Z axis. The first structure and the second structure extend along a plane. The plane along which the first structure and the second structure extend will be referred to as an "XY plane". The XY plane consists of an X axis and a Y axis that are orthogonal to each other. A direction going along the X axis will be referred to as an "X direction" or a "+X direction". A direction going along the Y axis will be referred to as a "Y direction" or a "+Y direction". A direction orthogonal to the XY plane and going from the first structure 100 toward the second structure 200 is referred to as a "Z direction" or a "+Z direction".

The first structure 100 and the second structure 200 are separately manufactured, and are then bonded together. Specifically, a structure obtained by inverting the second structure 200 with respect to the XY plane is formed, the formed structure is flipped with respect to the XY plane, and thereby the first structure 100 and the second structure 200 are joined. FIG. 3 shows a state prior to the bonding to facilitate understanding.

The first structure 100 includes a plurality of conductive bonding pads BP1. The second structure 200 includes a plurality of conductive bonding pads BP2. Each bonding pad BP1 of the first structure 100 faces a bonding pad BP2 of the second structure 200. As a result of the bonding of the first structure 100 and the second structure 200, each bonding pad BP1 of the first structure is brought into contact with a corresponding bonding pad BP2 of the second structure 200.

In one example, the first structure 100 has a structure that functions as components of the memory cell array 10. In one example, the second structure 200 has a structure that functions as components of the row decoder 11, the register 12, the sequencer 13, the voltage generator 14, the driver 15, and the sense amplifier 17.

1.1.3. Structure of Memory Device

Figure 4:
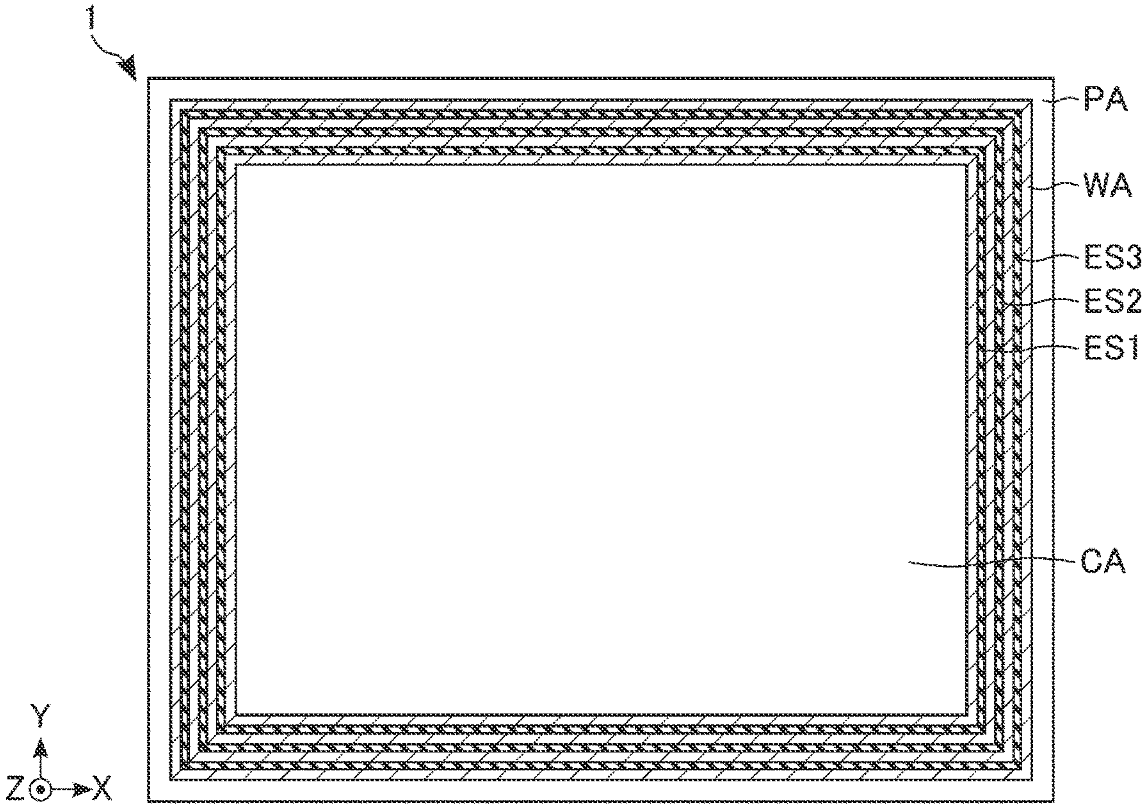
FIG. 4 shows an example of a structure along a plane of a part of the memory device according to the first embodiment.

FIG. 4 shows an example of a structure along a plane of a part of the memory device according to the first embodiment. FIG. 4 shows a structure of the memory device 1 as viewed from the +Z direction. The memory device 1 extends along the XY plane. The memory device 1 has a quadrilateral shape. The memory device 1 includes a cell region CA, a wall region WA, and a peripheral region PA.

The cell region CA is positioned in a region including the center of a region extending along the XY plane of the memory device 1. The cell region CA is a region including the memory cell transistors MT.

The wall region WA is a region surrounding the cell region CA along the XY plane. The wall region WA has the shape of a quadrilateral ring. The wall region WA includes one or more sealing members. FIG. 4 shows an example of three sealing members ES1, ES2, and ES3. The sealing members ES1, ES2, and ES3 have the shape of a quadrilateral ring. The sealing member ES2 surrounds the sealing member ES1 along the XY plane. The sealing member ES3 surrounds the sealing member ES2 along the XY plane. Each of the sealing members ES1, ES2, and ES3 extends in the +Z direction, and includes a plurality of sets of conductors that are mutually coupled. One or more of the sealing members ES1, ES2, and ES3 has a function of fixing an outer periphery of the memory device 1 to an identical potential (e.g., a ground voltage VSS) to stabilize a power-supply line, a well, etc., and/or a function of discharging the static electricity to the substrate 21, to be described later.

The peripheral region PA is a region surrounding the wall region WA along the XY plane. The peripheral region PA has the shape of a quadrilateral ring. The peripheral region PA is an outermost region as viewed along the XY plane of the memory device 1. The peripheral region PA does not include circuitry necessary for operating the memory device 1, such as the memory cell array 10, the row decoder 11, the register 12, the sequencer 13, the voltage generator 14, the driver 15, and the sense amplifier 17, and does not include elements or conductors included in such circuitry. Also, the peripheral region PA does not include sealing members such as the sealing members ES1, ES2, and ES3.

FIG. 5 schematically shows an example of a cross-sectional structure of a part of the memory device according to the first embodiment. FIG. 5 shows a structure taken along the XZ plane. A part of the structure shown in FIG. 5 will be discussed in detail later. In the description with reference to FIG. 5, the "Z direction" indicates the upward direction, the "−Z direction" indicates the downward direction, the "Y direction" indicates the right direction, and the "−Y direction" indicates the left direction.

As shown in FIG. 5, the first structure 100 further includes a semiconductor substrate 21 such as silicon, a metal-oxide-semiconductor (MOS) transistor Tr, a conductor set 22, and an insulator 23.

The transistor Tr is positioned in a region including an upper surface of the substrate 21 and on the upper surface. The conductor set 22 includes a plurality of conductors. Of the conductors in the conductor set 22, adjacent ones in the Z direction are in contact with each other. The conductor set 22 is, at its upper end, coupled to a bonding pad PD1.

The insulator 23 is provided in a region of the first structure 100 extending from the upper surface of the substrate 21 to an upper surface of the bonding pad PD1. In one example, the insulator 23 includes silicon oxide.

The second structure 200 includes a cell region CA and a peripheral region PA.

The second structure 200 further includes, in the cell region CA, a conductor set 26, a conductor 27, a conductor 28, a conductor 31, an insulator 30, an insulator 32, a conductor 33, an insulator 34, an insulator 36, a conductor 38, an insulator 39, an insulator 41, a conductor 42, an insulator 43, an insulator 45, a conductor 46, and a conductor 47.

A bonding pad PD2 is in contact with, at its lower surface, the upper surface of the bonding pad PD1.

The conductor set 26 includes a plurality of conductors. Of the conductors in the conductor set 26, adjacent ones in the Z direction are in contact with each other. A lower surface of the conductor set 26 is coupled to an upper surface of a corresponding bonding pad PD2.

The conductor 27 is disposed on an upper surface of a corresponding conductor set 26. The conductor 27 functions as a single bit line BL. In one example, the conductor 27 includes tungsten. The conductor 28 is disposed on an upper surface of the conductor 27.

The conductor 31 is, in the cell region CA, disposed above a layer of the conductor 28. The conductor 31 extends along the XY plane, and has a plate-like shape. The conductor 31 functions as at least part of the select gate line SGDL. In one example, the conductor 31 includes tungsten. The conductor 31 may include, at its surface, a further conductor such as aluminum oxide.

The insulator 30 is disposed in a region extending from a lower surface of the second structure 200 to the conductor 31. The insulator 30 extends over the cell region CA and the peripheral region PA. In one example, the insulator 30 includes silicon oxide.

The insulator 32 is disposed on an upper surface of the conductor 31. The insulator 32 extends along the XY plane, and has a plate-like shape. The insulator 32 extends over the cell region CA and the peripheral region PA. In one example, the insulator 32 includes silicon oxide.

A plurality of conductors 33 and a plurality of insulators 34 are, in the cell region CA, disposed one by one in an alternating manner along the Z direction on an upper surface of the insulator 32. Accordingly, the conductors 33 are arranged along the Z direction at a distance from one another or at intervals. Each of the conductors 33 and the insulators 34 extends along the XY plane, and has a plate-like shape. Each conductor 33 functions as at least part of the word line WL. In one example, the conductor 33 includes tungsten. The conductor 33 may include, at its surface, a further conductor such as aluminum oxide. In one example, the insulator 34 includes silicon oxide.

The insulator 36 is disposed on an upper surface of the topmost conductor 33. The insulator 36 extends along the XY plane, and has a plate-like shape. The insulator 36 extends over the cell region CA and the peripheral region PA. In one example, the insulator 36 contains silicon oxide. The insulator 36 includes, in the peripheral region PA, a concave portion 361 and a convex portion 362. The concave portion 361 is recessed toward the Z direction. The convex portion 362 is positioned above the concave portion 361.

A plurality of conductors 38 and a plurality of insulators 39 are, in the cell region CA, disposed one by one in an alternating manner along the Z direction on an upper surface of the insulator 36. Accordingly, the conductors 38 are arranged along the Z direction at a distance from one another or at intervals. Each of the conductors 38 and the insulators 39 extends along the XY plane, and has a plate-like shape. Each conductor 38 functions as at least part of the word line WL. In one example, the conductor 38 includes tungsten. The conductor 38 may include, at its surface, a further conductor such as aluminum oxide. In one example, the insulator 39 includes silicon oxide.

The insulator 41 is disposed on an upper surface of the topmost conductor 38. The insulator 41 extends along the XY plane, and has a plate-like shape. The insulator 41 extends over the cell region CA and the peripheral region PA. In one example, the insulator 41 includes silicon oxide.

The conductor 42 is disposed on an upper surface of the insulator 41. The conductor 42 extends along the XY plane, and has a plate-like shape. The conductor 42 functions as at least part of the select gate line SGSL. In one example, the conductor 42 includes tungsten. The conductor 42 may include, at its surface, a further conductor such as aluminum oxide.

The insulator 43 is disposed on an upper surface of the conductor 42. The insulator 43 extends along the XY plane, and has a plate-like shape. The insulator 43 extends over the cell region CA and the peripheral region PA. In one example, the insulator 43 includes silicon oxide.

A memory pillar MP is disposed in the cell region CA. The memory pillar MP extends along the Z direction, and has the shape of a pillar. The memory pillar MP is disposed in a stacked structure including the conductors 31, 33, 38, and 42, and the insulators 30, 32, 34, 36, 39, 41, and 43. The memory pillar MP penetrates the group of the conductors 31, 33, 38, and 42 and the insulators 30, 32, 34, 36, 39, 41, and 43. The memory pillar MP includes a lower surface positioned in the insulator 30.

The memory pillar MP includes a memory pillar LMP and a memory pillar UMP. A lower surface of the memory pillar LMP is in contact with an upper surface of the memory pillar UMP. The memory pillar LMP penetrates a set of the conductors 38 and 42 and the insulators 36, 39, 41, and 43. The memory pillar LMP includes an upper surface positioned in the insulator 45, and a lower surface positioned in the insulator 36. The memory pillar UMP penetrates a set of the conductors 31 and 33 and the insulators 30, 32, 34, and 36. The memory pillar UMP includes a lower surface positioned in the insulator 30.

Each of the memory pillars LMP and UMP has an XY area, which decreases from a lower surface to an upper surface. The XY area is an area of a section taken along the XY plane. An XY area of the lower surface of the memory pillar LMP is greater than an XY area of the upper surface of the memory pillar UMP. Accordingly, a side surface of the memory pillar LMP is deviated from, and is therefore not aligned with, an extended line from a side surface of the memory pillar UMP. Thus, the XY area of the memory pillar MP continuously changes in accordance with a change in position on the Z axis toward the Z direction, but discontinuously changes before and after the position at a boundary between the memory pillars LMP and UMP. The deviation between the side surface of the memory pillar LMP and the extended line of the side surface of the memory pillar UMP occurs not only in the XZ cross section as shown in FIG. 4, but also occurs in other cross sections including the Z axis.

Each memory pillar MP includes a core 50, a semiconductor 51, and a layer stack 52. The core 50 extends along the Z direction, and has the shape of a pillar. A side surface of the core 50 extends along a side surface of the memory pillar MP. That is, the core 50 includes a portion included in the memory pillar LMP and a portion included in the memory pillar UMP. A lower surface of the portion of the core 50 included in the memory pillar LMP and an upper surface of the portion of the core 50 included in the memory pillar UMP are connected. Each of the portion of the core 50 included in the memory pillar LMP and the portion of the core 50 included in the memory pillar UMP has an XY area, which decreases from a lower surface toward an upper surface. In one example, the core 50 includes silicon oxide.

The semiconductor 51 covers a surface of the core 50. A side surface of the semiconductor 51 extends along the side surface of the memory pillar MP. In one example, the semiconductor 51 includes silicon. The semiconductor 51 includes, at its topmost part, a trench 511. The trench 511 extends along the Z direction. An upper end of the trench 511 reaches above an upper surface of the insulator 43. The topmost part of the semiconductor 51 extends along the XY plane above the insulator 43. The structure of the topmost part of the semiconductor 51 will be discussed in detail later, with reference to FIG. 7.

The layer stack 52 covers a side surface of the semiconductor 51. A side surface of the layer stack 52 extends along the side surface of the memory pillar MP. The topmost part of the layer stack 52 is positioned above the upper surface of the insulator 43.

A portion at which the memory pillar MP and the conductor 31 face each other functions as the select gate transistor DT. A portion at which the memory pillar MP faces one of the conductors 33 or 38 functions as a single memory cell transistor MT. A portion at which the memory pillar MP and the conductor 42 face each other functions as a single select gate transistor DT. A plurality of conductors 31 may be provided, and portions at which the plurality of conductors 31 and the memory pillar MP face each other may function as a plurality of select gate transistors DT that are coupled in series. A plurality of conductors 42 may be provided, and portions at which the plurality of conductors 42 and the memory pillar MP face each other may function as a plurality of select gate transistors ST that are coupled in series.

The insulator 45 is disposed on the upper surface of the insulator 43. The insulator 45 extends along the XY plane, and has a plate-like shape. The insulator 45 extends over the cell region CA and the peripheral region PA. The insulator 45 includes, above the memory pillar MP, an opening 451 that extends from its upper surface to its lower surface. The topmost part of the memory pillar MP is positioned in the opening 451. In one example, the insulator 45 includes silicon oxide.

The conductor 46 is disposed on an upper surface of the insulator 43. The conductor 46 includes, in the opening 451 of the insulator 45, a portion positioned on a side surface of the insulator 45. The conductor 46 covers a surface of the trench 511 of the semiconductor 51, and covers the semiconductor 51 in the trench 511. In one example, the conductor 46 includes titanium and/or titanium nitride. A structure of a portion above the memory pillar MP of the conductor 46 will be discussed in detail later, with reference to FIG. 7.

The conductor 47 covers the conductor 46. The conductor 47 functions as at least a part of the source line SL. In one example, the conductor 47 includes tungsten.

The second structure 200 further includes, in the peripheral region PA, insulators SM1, SM2, SM3, and SM4, and spacer films 61, 62, 63, and 64.

The insulator SM1 is disposed between the insulator 30 and the insulator 32. The insulator SM1 extends along the XY plane, and has a plate-like shape. In one example, the insulator SM1 includes silicon nitride.

The insulators SM2 and the insulators 34 are, on the upper surface of the insulator 32, disposed one by one in an alternating manner along the Z direction. Accordingly, the insulators SM2 are arranged along the Z direction at a distance from one another or at intervals. The insulator SM2 extends along the XY plane, and has a plate-like shape. In one example, the insulator SM2 includes silicon nitride. Some of the insulators SM2 arranged along the Z direction, including the topmost one, and some of the insulators 34 that are adjacent to one another, including the topmost one, include a portion projecting in the Z direction in the convex portion 361.

The insulator 36 is disposed on an upper surface of the topmost insulator SM2 in the peripheral region PA.

The insulators SM3 and the insulators 39 are, on the upper surface of the insulator 36, disposed one by one in an alternating manner along the Z direction. Accordingly, the insulators SM3 are arranged along the Z direction at a distance from one another or at intervals. The insulator SM3 extends along the XY plane, and has a plate-like shape. In one example, the insulator SM3 includes silicon nitride. Some of the insulators SM3 arranged along the Z direction, including the bottommost one, and some of the insulators 39 arranged along the Z direction, including the bottommost one, include a portion projecting in the Z direction along the convex portion 362.

The insulator 41 is disposed on an upper surface of the topmost insulator SM3. The insulator 41 includes a portion projecting in the Z direction along the convex portion 362.

The insulator SM4 is disposed on the upper surface of the insulator 41. The insulator SM4 extends along the XY plane, and has a plate-like shape. In one example, the insulator SM4 includes silicon nitride. The insulator SM4 includes a portion projecting in the z direction along the convex portion 362.

The spacer film 61 is positioned in the insulator 36. The spacer film 61 extends along the Z direction, and has an angle with respect to the Z axis. The two spacer films 61 are two separate portions formed of an originally single film. The two spacer films 61 have a line-symmetric relationship with respect to a YZ plane. An interval between upper ends of the two spacer films 61 is smaller than an interval between lower ends of the two spacer films 61. The two spacer films 61 are positioned in the concave portion 361. The two spacer films 61 surround the portions of the insulators SM2 and 34 projecting in the Z direction. The portion of the insulators SM2 and 34 projecting in the Z direction includes portions extending along the respective spacer films 61. A lower end of the spacer film 61 is aligned with the boundary between the memory pillars LMP and UMP. Examples of the spacer film 61 include polysilicon, silicon oxide, and carbon.

The spacer film 62 extends along the Z direction, and has an angle with respect to the Z axis. The two spacer films 62 are two independent portions formed of an originally single film. The two spacer films 62 have a line-symmetric relationship with respect to a YZ plane. An interval between upper ends of the two spacer films 62 is smaller than an interval between lower ends of the two spacer films 62. A lower end of the spacer film 62 is aligned with the boundary between the memory pillars LMP and UMP. The set of two spacer films 62 is positioned on the inside of the set of two spacer films 61. Each spacer film 62 is disposed on a side surface of a corresponding spacer film 61. The left spacer film 62 is disposed on a right side surface of the left spacer film 61. The right spacer film 62 is disposed on a left side surface of the right spacer film 61. A material of the spacer film 62 differs from materials of the insulators SM2, 34, 32, SM1, and 30. In one example, the spacer film 62 includes carbon or metal.

The spacer film 63 is positioned in the insulator 45. The spacer film 63 extends along the Z direction, and has an angle with respect to the Z axis. The two spacer films 63 are two independent portions formed of an originally single film. The two spacer films 63 have a line-symmetric relationship with respect to a YZ plane. An interval between upper ends of the two spacer films 63 is smaller than an interval between lower ends of the two spacer films 63. The two spacer films 63 surround the portions of the insulators SM3, SM4, and 39 projecting in the Z direction. The portion of the insulators SM3 and 39 projecting in the Z direction includes portions extending along the respective spacer films 63. The spacer film 63 is disposed on a side closer to the Z direction in a layer of the conductor 42. In one example, the spacer film 63 includes polysilicon.

The spacer film 64 extends along the Z direction, and has an angle with respect to the Z axis. The two spacer films 64 are two independent portions formed of an originally single film. The two spacer films 64 have a line-symmetric relationship with respect to a YZ plane. An interval between upper ends of the two spacer films 64 is smaller than an interval between lower ends of the two spacer films 64. The set of two spacer films 64 are positioned on the inside of the set of two spacer films 63. Each spacer film 64 is disposed on a side surface of a corresponding spacer film 63. The left spacer film 64 is disposed on a right side surface of the left spacer film 63. The right spacer film 64 is disposed on a left side surface of the right spacer film 63. A material of the spacer film 64 differs from materials of the insulators 43, SM4, 41, SM3, 39, and 36. In one example, the spacer film 64 includes carbon or metal.

Figure 6:
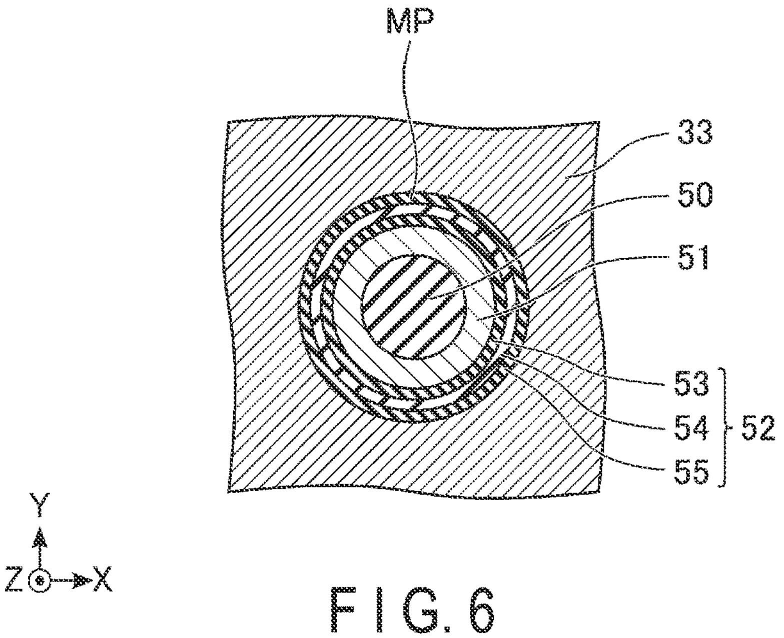
FIG. 6 shows an example of a cross-sectional structure of a memory pillar of the memory device according to the first embodiment.

FIG. 6 shows an example of a cross-sectional structure of a memory pillar of the memory device according to the first embodiment. Specifically, FIG. 6 shows a cross section taken along line VI-VI in FIG. 5. As shown in FIG. 6, in one example, the layer stack 52 includes a tunnel insulator 53, a charge storage film 54, and a block insulator 55.

The tunnel insulator 53 surrounds a side surface of the semiconductor 51. The charge storage film 54 surrounds a side surface of the tunnel insulator 53. The block insulator 55 surrounds a side surface of the charge storage film 54. The conductor 33 surrounds a side surface of the block insulator 55.

The semiconductor 51 functions as a channel (current path) of the memory cell transistors MT and the select gate transistors DT and ST. Each of the tunnel insulator 53 and the block insulator 55 includes, for example, silicon oxide. The charge storage film 54 stores charge. The charge storage film 54 includes, for example, silicon nitride.

Figure 7:
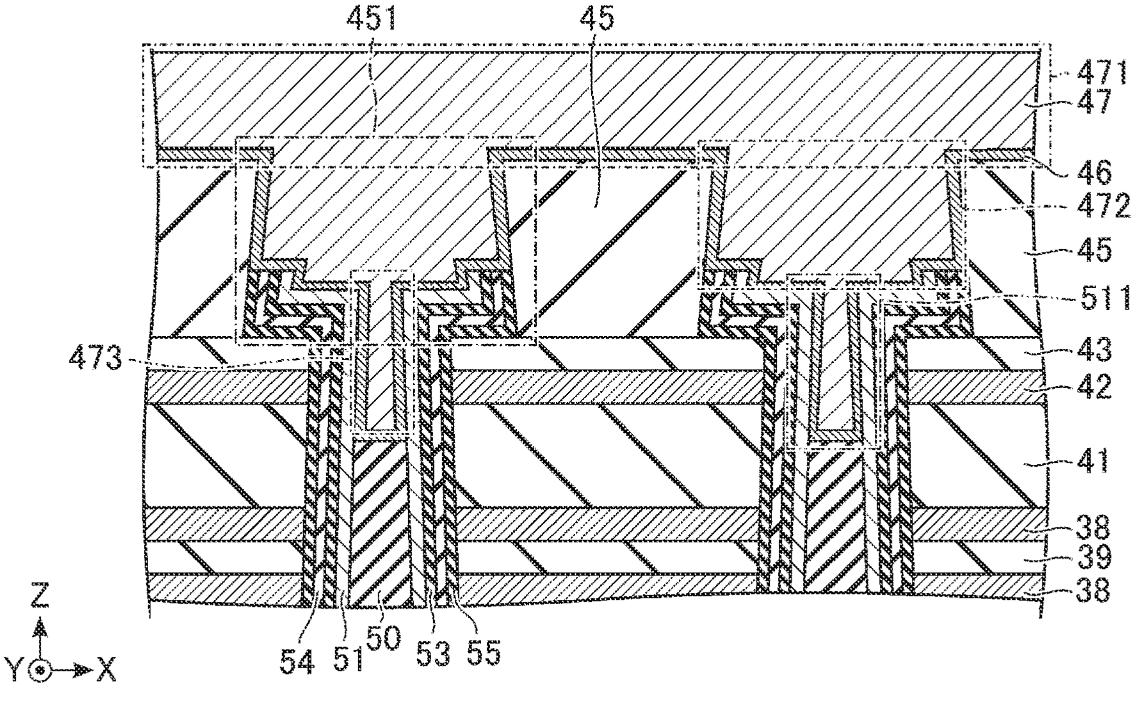
FIG. 7 shows an example of a cross-sectional structure of a part of the memory device according to the first embodiment.

FIG. 7 shows an example of a cross-sectional structure of a part of the memory device according to the first embodiment. FIG. 7 is an enlarged view of a topmost part of the structure shown in FIG. 6, showing the cell region CA. In the description with reference to FIG. 7, the "Z direction" indicates the upward direction, the "−Z direction" indicates the downward direction, the "Y direction" indicates the right direction, and the "−Y direction" indicates the left direction.

The block insulator 55 includes, at its topmost part, a portion positioned on the upper surface of the insulator 43 and a portion positioned on a side surface of the insulator 45.

A topmost part of the charge storage film 54 has a shape that follows the shape of the block insulator 55, covering a surface of the block insulator 55. That is, the charge storage film 54 includes, at its topmost part, a portion extending along the XY plane above the insulator 43 and a portion extending along the Z direction.

A topmost part of the tunnel insulator 53 has a shape that follows the shape of the charge storage film 54, covering a surface of the charge storage film 54. That is, the tunnel insulator 53 includes, at its topmost part, a portion extending along the XY plane above the insulator 43 and a portion extending along the Z direction.

A bottom of the trench 511 of the semiconductor 51 is in contact with an upper surface of the core 50. A portion of the semiconductor 51 surrounding a side surface of the trench 511 covers a surface of the tunnel insulator 53. A topmost part of the semiconductor 51 has a shape that follows the shape of the tunnel insulator 53, and covers a surface of the tunnel insulator 53. That is, the semiconductor 51 includes, at its topmost part, a portion extending along the XY plane above the insulator 43 and a portion extending along the Z direction.

The conductor 46 covers an upper surface of the insulator 45, a portion of the side surface of the insulator 45 not covered by the block insulator 55, an upper surface of the block insulator 55, an upper surface of the charge storage film 54, an upper surface of the tunnel insulator 53, an upper surface of the semiconductor 51, and a surface of the trench 511 of the semiconductor 51.

The conductor 47 covers a surface of the conductor 46. The conductor 47 includes a first portion 471, a plurality of second portions 472, and a plurality of third portions 473. The first portion 471 occupies a topmost part of the conductor 47, has a linear shape, and extends in the X direction. Each second portion 472 occupies an interior portion of the opening 451 of the insulator 45. Each second portion 472 is, at its upper end, coupled to a lower surface of the first portion 471. Each third portion 473 occupies an interior portion of a corresponding trench 511 of the semiconductor 51. The third portion 473 extends along the Z direction. Each third portion 473 is, at its upper end, coupled to a lower end of a corresponding second portion 472.

1.2. Manufacturing Method

FIGS. 8 to 30 sequentially show cross-sectional structures during manufacturing of the memory device according to the first embodiment. FIG. 8 to FIG. 26 show the first structure 100 in the region shown in FIG. 5. FIG. 27 to FIG. 30 show the region shown in FIG. 7.

The first structure 100 is manufactured by sequentially forming layers toward the −Z direction, and then a structure obtained by flipping the structure being manufactured of the first structure 100 with respect to the XY plane is bonded to the second structure 200. FIGS. 8 to 26 show a state in which the orientation and the up/down directions of the first structure 100 shown in FIG. 5 are inverted. That is, in the description with reference to FIGS. 8 to 26, the terms "above", "upper", "top" etc. indicate the −Z direction, and the terms "below", "lower", "bottom" etc. indicate the Z direction.

Figure 8:
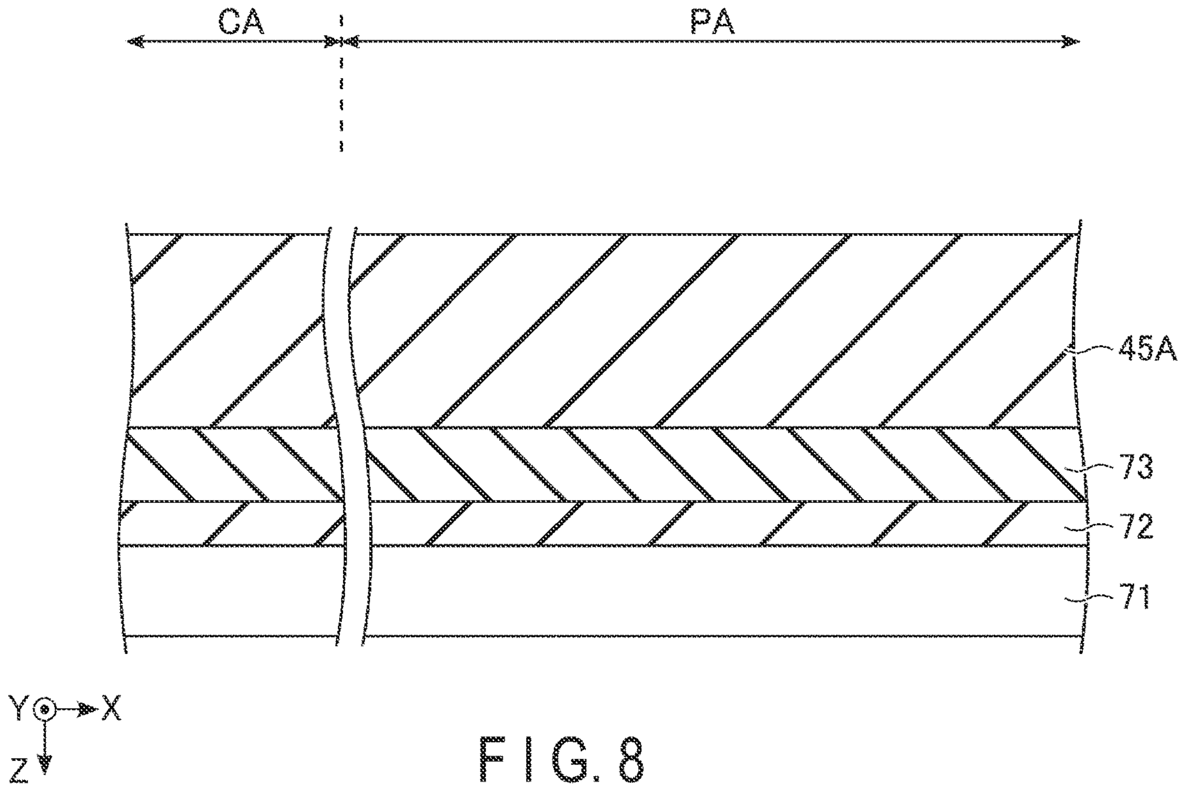

As shown in FIG. 8, an insulator 72 is deposited on an upper surface of a substrate 71 such as silicon. Examples of the deposition method include chemical vapor deposition (CVD). The substrate 71 and the insulator 72 extend along the XY plane. In one example, the insulator 72 includes silicon oxide.

A film 73 is formed on an upper surface of the insulator 72. The film 73 extends along the XY plane. The film 73 includes the same material as the spacer film 63.

An insulator 45A is formed on an upper surface of the film 73. The insulator 45A is a component to be formed into an insulator 45 at a later step. The insulator 45A extends along the XY plane.

Figure 9:
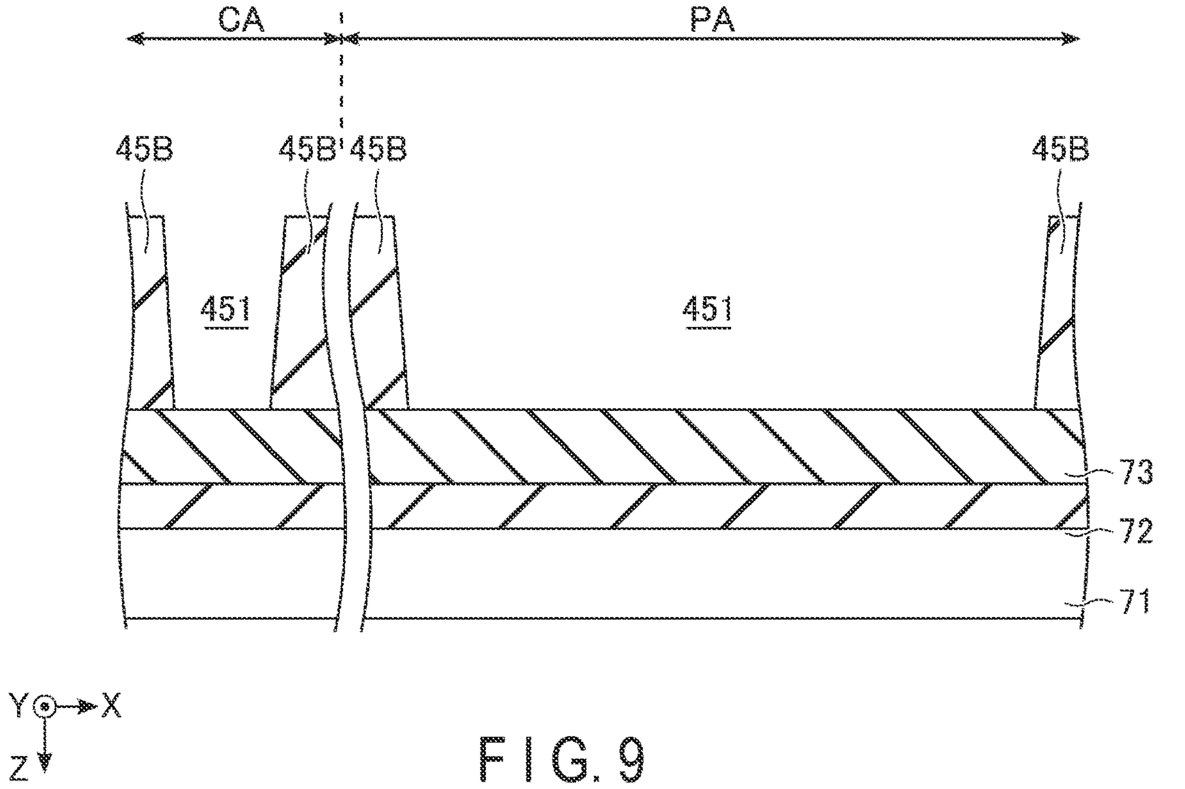

As shown in FIG. 9, an opening 451 is formed by partially removing the insulator 45A. Specifically, a mask including an opening is formed on an upper surface of the insulator 45A above a region in which the opening 451 is to be formed, and the insulator 45 is partially removed by anisotropic etching via the opening of the mask. Examples of the anisotropic etching include reactive ion etching (RIE). The opening 451 extends from an upper surface to a lower surface of the insulator 45A. Through the formation of the opening 451, an insulator 45B of the insulator 45A remains. In one example, an upper end of the opening 451 has a smaller XY area than its lower end. The XY area is an area of a section taken along the XY plane.

As shown in FIG. 10, a film 63A is deposited. Examples of the deposition method include CVD. The film 63A is a component to be formed into a spacer film 63 at a later step. The film 63A covers an upper surface of the insulator 45B, and fills in the opening 451 in the cell region CA. The film 63A covers a surface of the opening 451 in the peripheral region PA.

As shown in FIG. 11, the film 63A is partially removed by etch-back. A portion of the film 63A on an upper surface of the insulator 45B is removed. In the cell region CA, the film 63A remains in the opening 451, and is formed into a film 63B. The film 63B is, in the opening 451, positioned only in the lower portion. A height of the portion removed from the upper surface of the film 63A is very small compared to the height of the memory pillar MP. Accordingly, a variation in the position of the upper surface of the film 63B is small.

In the peripheral region PA, a portion of the film 63A on a bottom surface of the opening 451 is removed. The film 63A has a small thickness at a portion on a side surface of the opening 451 in the peripheral region PA, and is formed into a spacer film 63.

As shown in FIG. 12, a film 64A is deposited. Examples of the deposition method include CVD. The film 64A is a component to be formed into a spacer film 64 at a later step. Materials of the film 64A include a material that differs from materials of the insulators 43, SM4, 41, SM3, 39, and 36. The film 64A covers an upper surface of the insulator 45B. Also, the film 64A fills in a region of an interior portion of the opening 451 not filled in by the film 63B in the cell region CA. In the peripheral region PA, the film 64A covers the spacer film 63, and covers the bottom surface of the opening 451.

As shown in FIG. 13, the film 64A is partially removed by etch-back. A portion of the film 64A on an upper surface of the insulator 45B is removed. In the cell region CA, the film 64A remains in the opening 451, and is formed into a film 64B. As described with reference to FIG. 10, since a variation in the position of the upper surface of the film 63B is small, a variation in the position of the lower surface of the film 64B is also small. In the peripheral region PA, a portion of the film 64A on a bottom surface of the opening 451 is removed. A portion of the film 64A on the spacer film 63 remains, and is formed into a spacer film 64.

Figure 14:
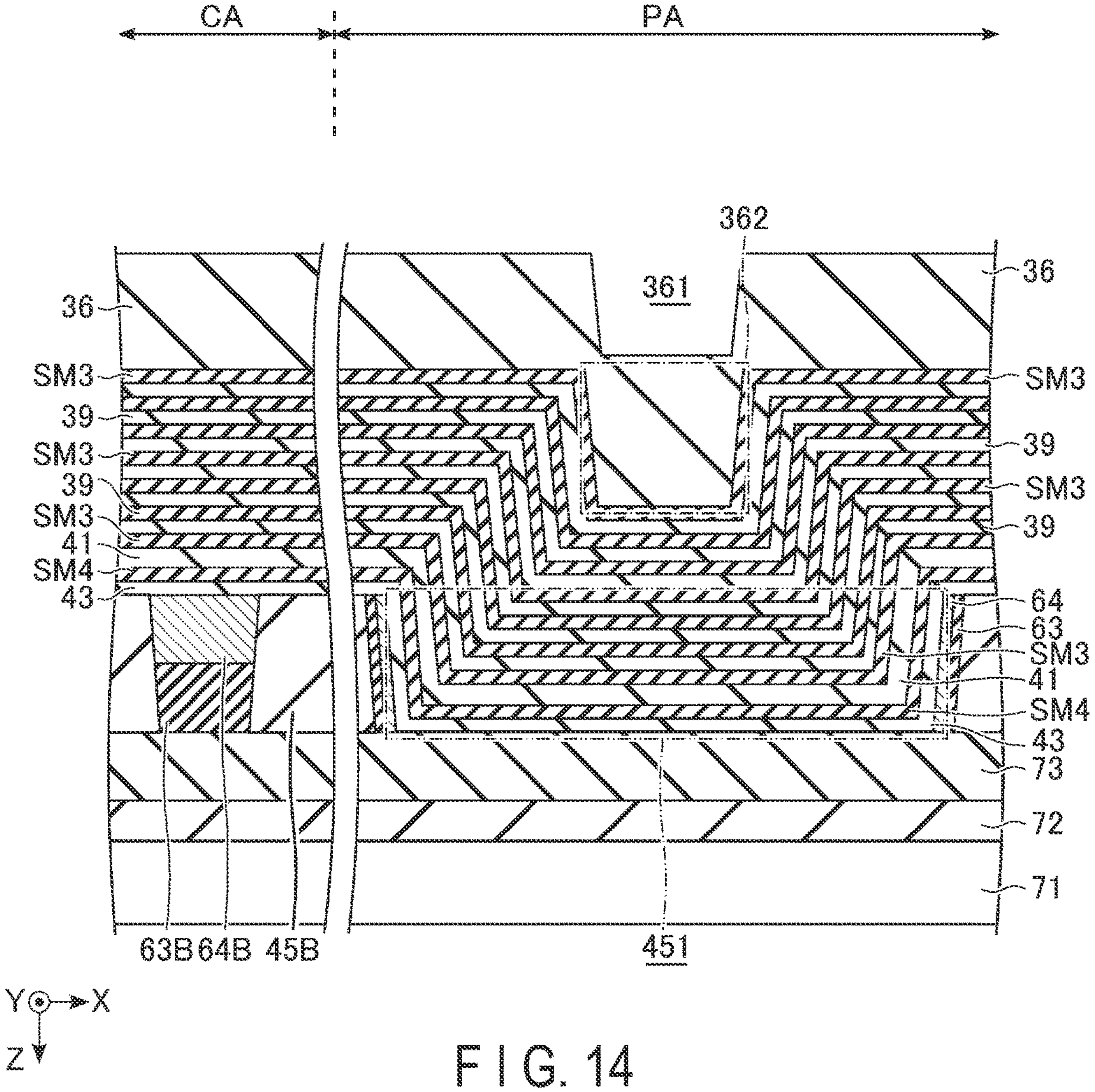

As shown in FIG. 14, a layer stack of insulators 43, SM4, 41, SM3, 39, and 36 is deposited. Examples of the deposition method include CVD. The insulator SM4 is deposited on the upper surface of the insulator 43. The insulator 41 is deposited on an upper surface of the insulator SM4. The insulators SM3 and 39 are, on an upper surface of the insulator 41, deposited one by one in an alternating manner. The insulator 36 is deposited on an upper surface of the topmost insulator SM3. The insulator SM4 occupies a region in which the conductor 42 is to be formed. The insulator SM3 occupies a region in which the conductor 38 is to be formed. The layer stack is, in the cell region CA, formed on upper surfaces of the insulator 45B and the film 64B. In the peripheral region PA, a part of a bottommost part of the layer stack is positioned in the opening 451. The opening 451 in the peripheral region PA is filled in by a part of the layer stack. Since a part of a lower part of the layer stack is positioned in the opening 451, a concave portion 361 and a convex portion 362 of the insulator 36 are formed above the opening 451.

As shown in FIG. 15, a memory hole LMH is formed. Specifically, first, a mask is formed. The mask includes an opening above a region in which the memory pillar LMP is to be formed. Anisotropic etching such as RIE is performed using the mask. Thereby, the layer stack of the insulators 43, SM4, 41, SM3, 39, and 36 is partially removed, and the memory hole LMH is formed. The memory hole LMH extends along the Z direction, and reaches a portion below the insulator 43.

A material of the film 64B differs from the materials of the insulators 43, SM4, 41, SM3, 39, and 36. Accordingly, the film 64B functions as a stopper for etching of the insulators 43, SM4, 41, SM3, 39, and 36. That is, the film 64B is etched only by a small amount through etching of the insulators 43, SM4, 41, SM3, 39, and 36. Thereby, a variation in the position of the bottom of the memory hole LMH is suppressed.

Figure 16:
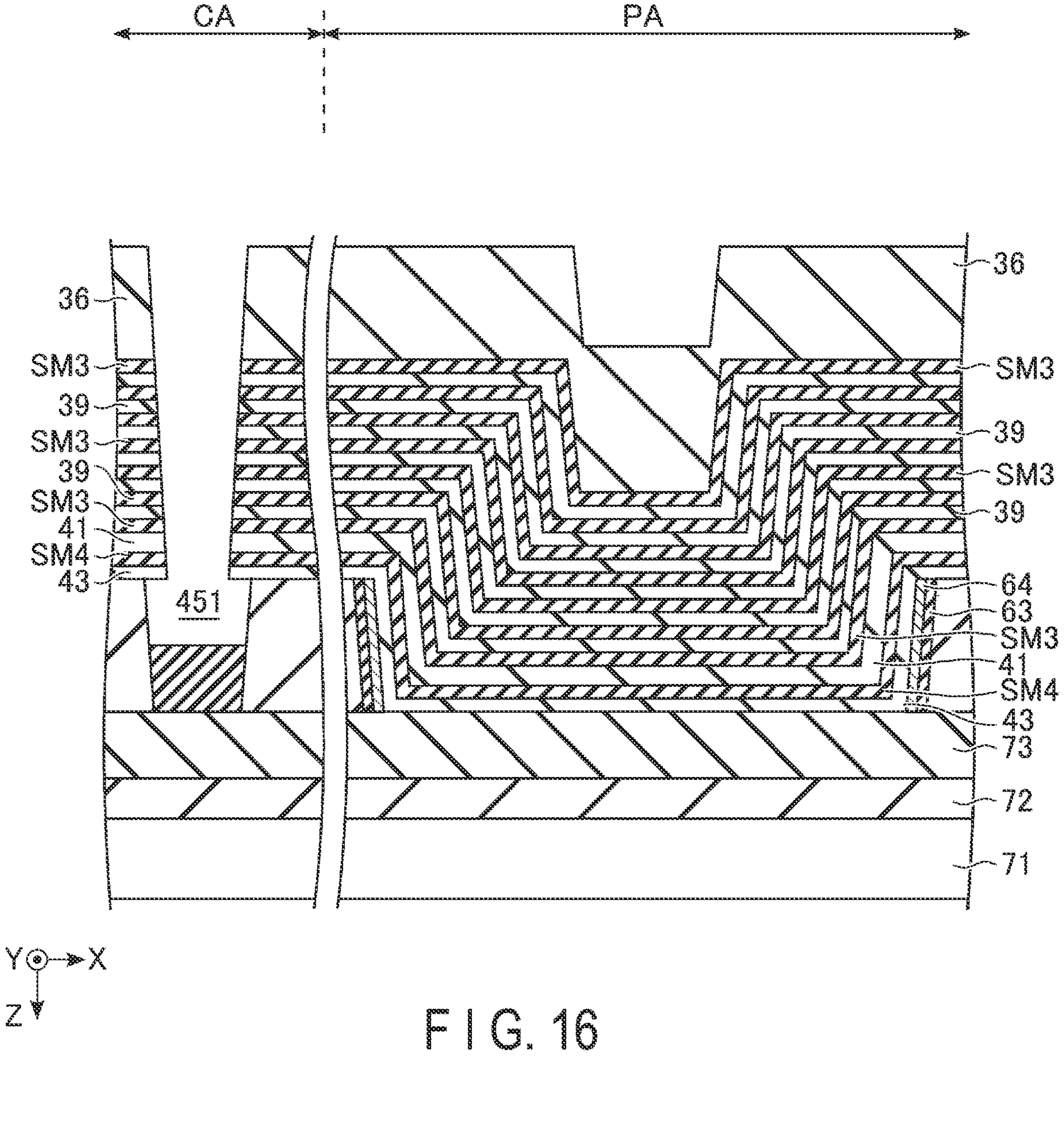

As shown in FIG. 16, the mask and the film 64B in the cell region CA are removed. As a result, an upper part of the opening 451 is formed again in the cell region CA. A position of a bottom of the upper part of the opening 451 depends on a position of an upper surface of the film 64B, and a variation in the position of the upper surface of the film 64B is small, as described above with reference to FIG. 10. Thus, a variation in the position of the bottom of the upper part of the opening 451 is small.

Figure 17:
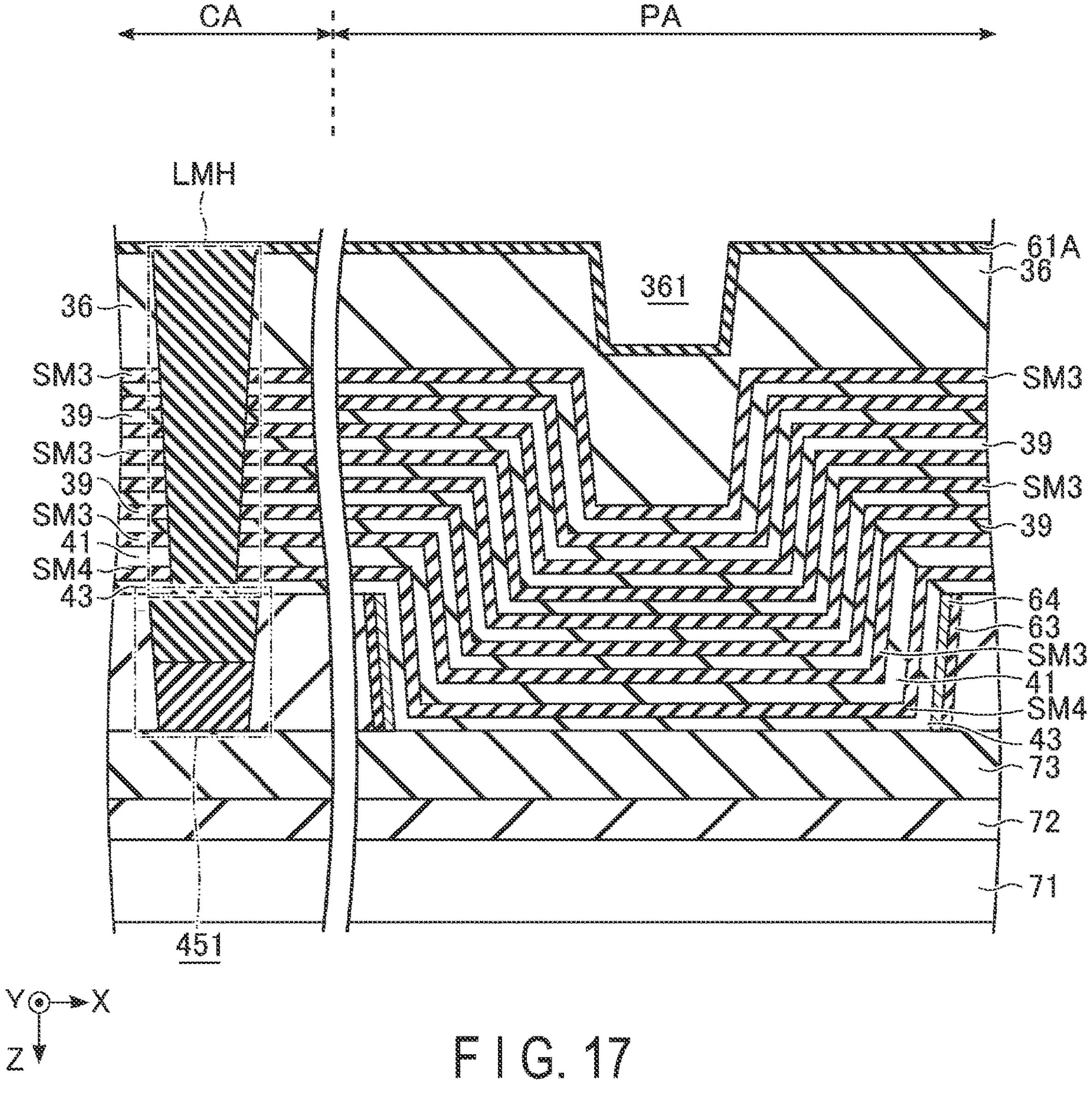

As shown in FIG. 17, a film 61A is deposited. Examples of the deposition method include CVD. The film 61A is a component to be formed into a spacer film 61 at a later step. The film 61A covers an upper surface of the insulator 36. The film 61A fills in, in the cell region CA, the upper part of the opening 451 and the memory hole LMH. The film 61A covers, in the peripheral region PA, a surface of the concave portion 361.

As shown in FIG. 18, the film 61A is partially removed by etch-back. A portion of the film 61A on an upper surface of the insulator 36 is removed. A topmost part of an interior portion of the memory hole LMH in the film 61A is removed. As a result, a space is formed in the topmost part of the memory hole LMH. A portion other than the topmost part in the memory hole LMH of the film 61A remains, and is formed into a film 61B. In the peripheral region PA, a portion of the film 61A on a bottom surface of the concave portion 361 is removed. A portion of the film 61A on a side surface of the concave portion 361 remains, and is formed into a spacer film 61.

As shown in FIG. 19, a film 62A is deposited. Examples of the deposition method include CVD. The film 62A is a component to be formed into a spacer film 62 at a later step. A material of the film 62A differs from materials of the insulators SM2, 34, 32, SM1, and 30. The film 62A covers an upper surface of the insulator 36. The film 62A fills in the topmost part of the memory hole LMH. The film 62A covers the spacer film 61 in the peripheral region PA, and covers the bottom of the concave portion 361.

As shown in FIG. 20, the film 62A is partially removed by etch-back. A portion of the film 62A on an upper surface of the insulator 36 is removed. The film 62A remains at the topmost part of the memory hole LMH, and is formed into a film 62B. In the peripheral region PA, a portion of the film 62A on the bottom surface of the opening 451 is removed. A portion of the film 62A on the spacer film 61 remains, and is formed into a spacer film 62.

Figure 21:
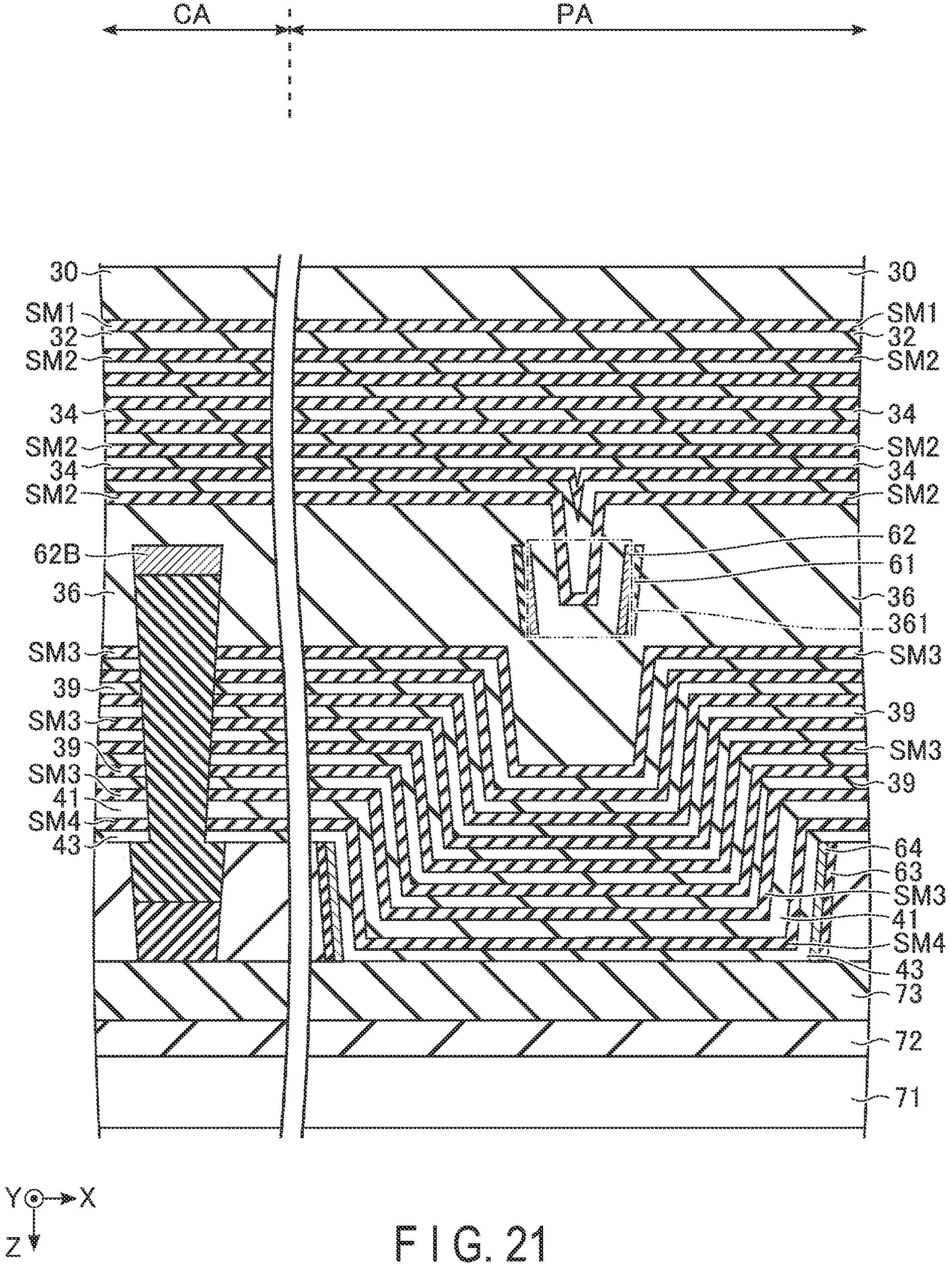

As shown in FIG. 21, a topmost part of the insulator 36 is deposited on upper surfaces of the insulator 36 and the film 62B, and then a layer stack of insulators SM2, 34, 32, SM1, and 30 is deposited. Examples of the deposition method include CVD. The topmost part of the insulator 36 covers a surface of the concave portion 361. The insulators SM2 and 34 are, on an upper surface of the insulator 36, deposited one by one in an alternating manner. The insulator SM2 occupies a region in which the conductor 33 is to be formed. The insulator SM1 occupies a region in which the conductor 31 is to be formed.

The insulator 32 is deposited on an upper surface of the topmost insulator SM2. The insulator SM1 is deposited on the upper surface of the insulator 32. The insulator SM1 occupies a region in which the conductor 31 is to be formed. The insulator 30 is deposited on an upper surface of the insulator SM1.

In the peripheral region PA, a part of a bottommost part of the layer stack is positioned in the concave portion 361. The concave portion 361 is filled in by a part of the layer stack.

As shown in FIG. 22, a memory hole UMH is formed. Specifically, first, a mask 77 is formed. The mask 77 includes an opening above a region in which the memory pillar UMP is to be formed. Anisotropic etching such as RIE is performed using the mask 77. Thereby, the layer stack of the insulators SM2, 34, 32, SM1, and 30 is partially removed, and the memory hole UMH is formed. The memory hole UMH extends along the Z direction, and reaches below the bottommost insulator SM2.

A material of the film 62B differs from materials of the insulators SM2, 34, 32, SM1, and 30. Accordingly, the film 62B functions as a stopper for etching of the insulators SM2, 34, 32, SM1, and 30. Through the etching, the topmost part of the film 62B is removed.

Figure 23:
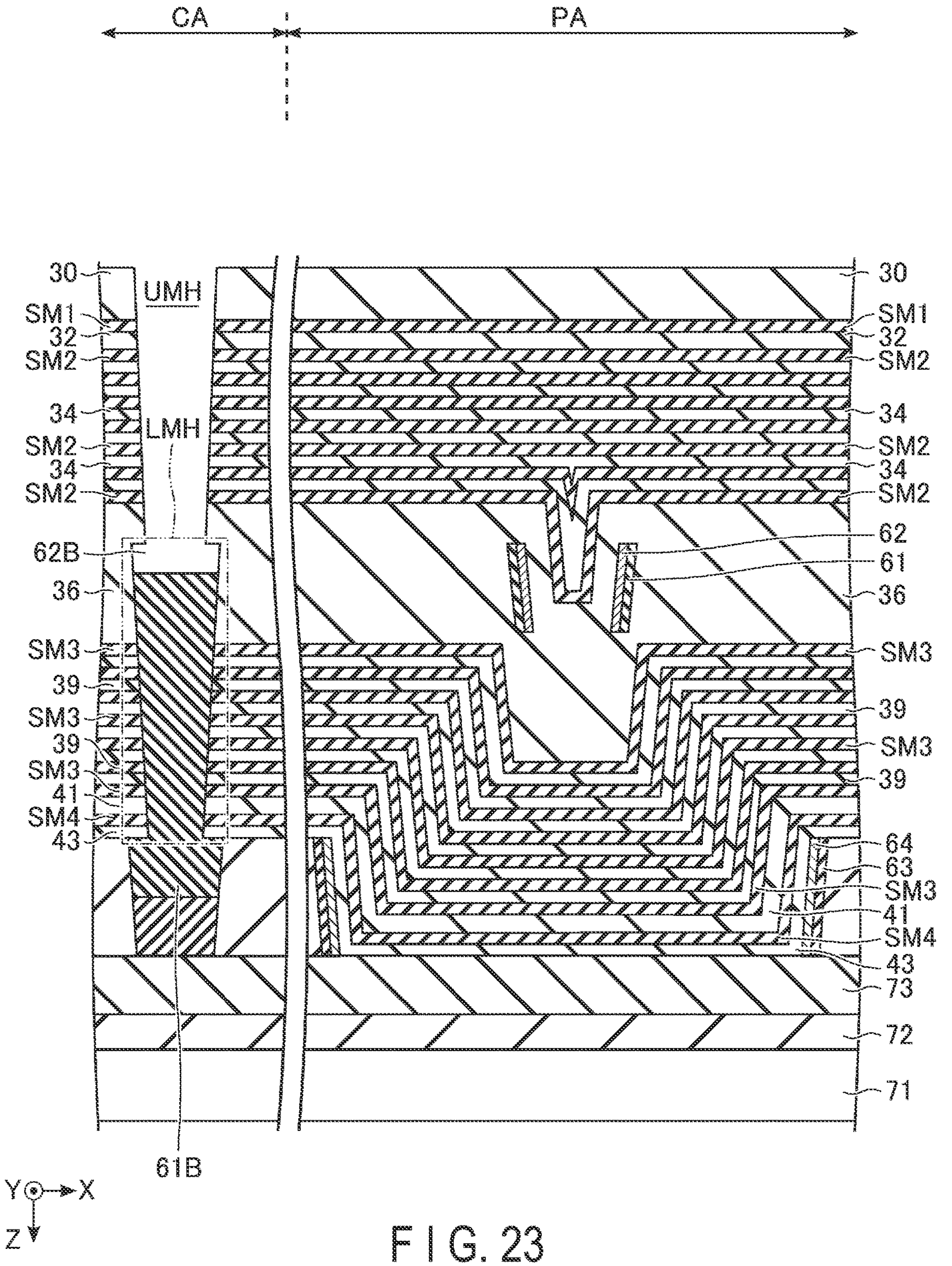

As shown in FIG. 23, the mask 77 and the film 62B are removed. Examples of the removal method include wet etching. As a result of the removal of the film 62B, a topmost part of the memory hole LMH is formed again, and an upper surface of the film 61B is exposed.

Figure 24:
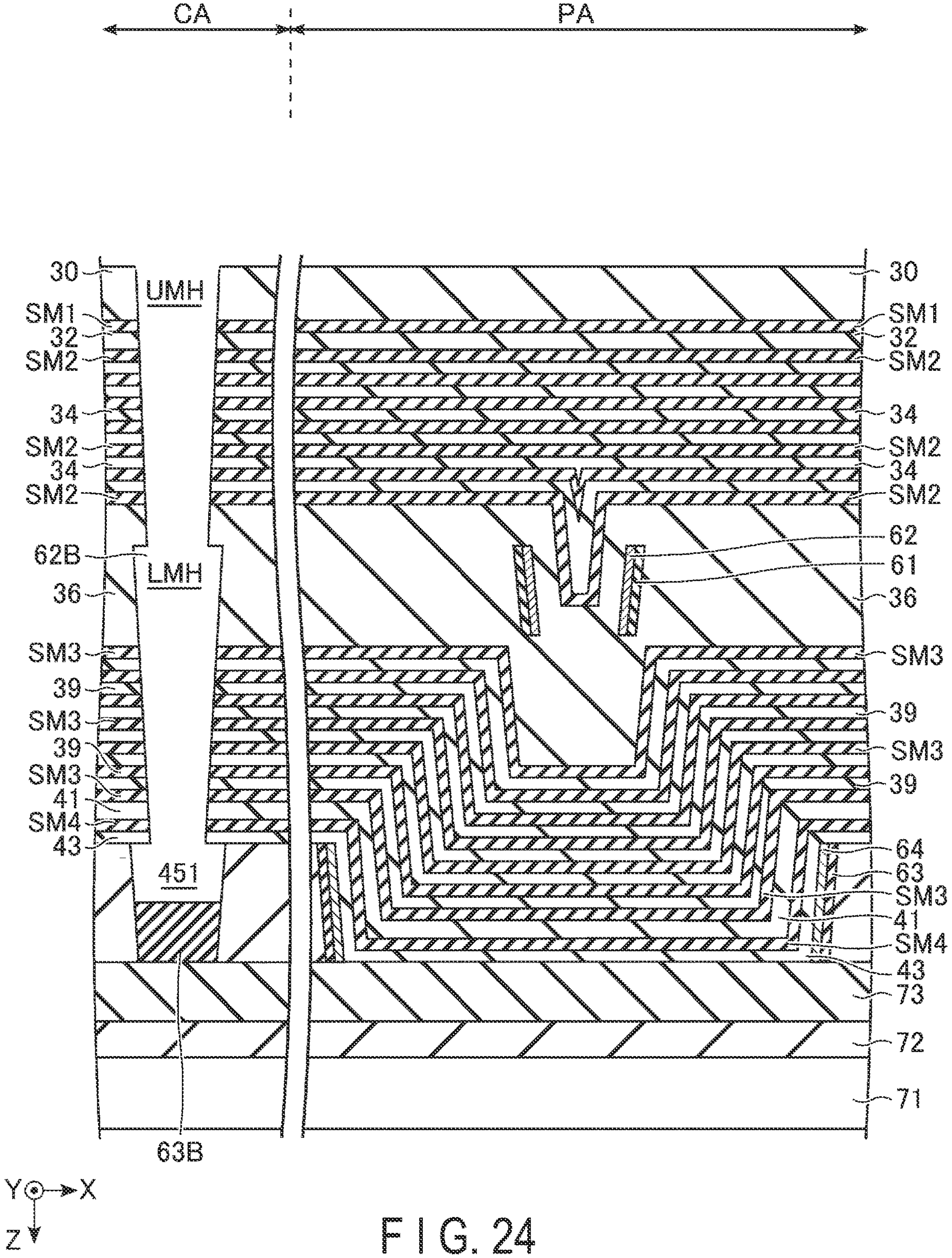

As shown in FIG. 24, the film 61B is removed. Examples of the removal method include wet etching and ashing. As a result of the removal of the film 61B, an entirety of the memory hole LMH and an upper part of the opening 451 are formed again.

Figure 27:
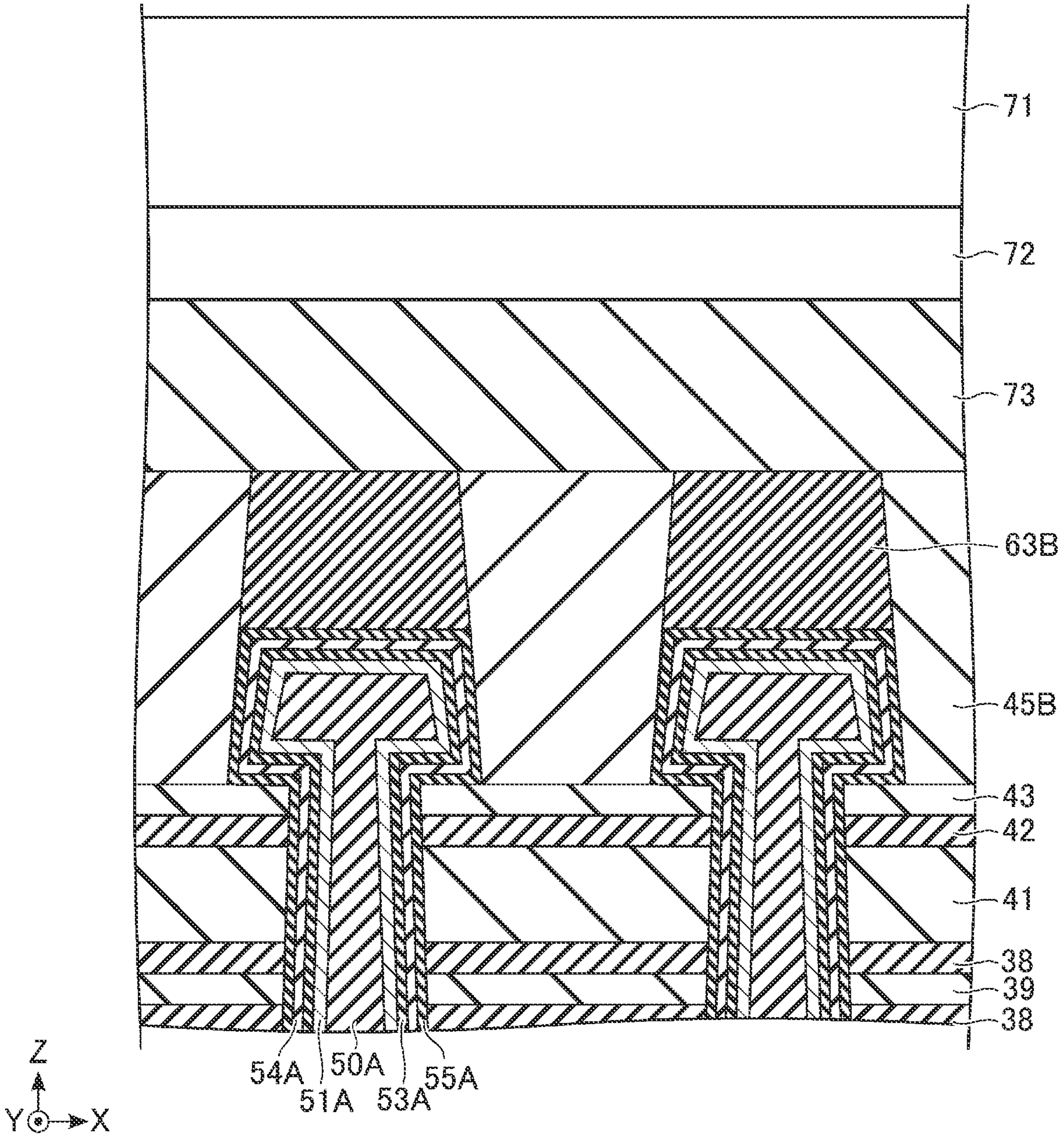

As shown in FIGS. 25 and 27, the layer stack 52A, the semiconductor 51A, and the core 50A are deposited. The layer stack 52A is a component to be formed into a layer stack 52 at a later step. The semiconductor 51A is a component to be formed into a semiconductor 51 at a later step. The core 50A is a component to be formed into a core 50 at a later step.

Specifically, first, a block insulator 55A, a charge storage film 54A, a tunnel insulator 53A, a semiconductor 51A, and a core 50A are deposited on surfaces of the memory holes UMH and LMH. Examples of the deposition method include CVD. The block insulator 55A is a component to be formed into an insulator 55 at a later step. The charge storage film 54A is a component to be formed into a charge storage film 54 at a later step. The tunnel insulator 53A is a component to be formed into a tunnel insulator 53 at a later step. Through the deposition of the core 50A on a surface of the semiconductor 51A, the centers of the memory holes UMH and LMH and the center of an upper part of the opening 451 is filled in by the core 50A.

An upper part of the core 50A is removed, and the semiconductor 51A is formed in the removed part. An upper surface of the semiconductor 51 as well as an upper surface of the insulator 30 is planarized. Examples of the planarization method include chemical mechanical polishing (CMP).

As shown in FIG. 26, in the cell region CA, the insulator SM1 is replaced with the conductor 31, the insulator SM2 is replaced with the conductor 33, the insulator SM4 is replaced with the conductor 42, and the insulator SM3 is replaced with the conductor 38. Specifically, first, the insulators SM1, SM2, SM3, and SM4 are removed. Examples of the removal method include wet etching. A wet etching chemical reaches, in a slit (not illustrated) extending along the Z direction similarly to the set of memory holes UMH and LMH, the insulators SM1, SM2, SM3, and SM4, and removes the insulators SM1, SM2, SM3, and SM4. As a result, a space is formed in a region in which the insulators SM1, SM2, SM3, and SM4 were positioned. Subsequently, conductors 31, 33, 38, and 42 are formed in the space. Examples of the formation method include CVD.

During the subsequent process shown in FIGS. 28 to 30, the peripheral region is covered by a mask.

As shown in FIG. 28, the substrate 71 is peeled off, and then the insulator 72 is removed. Examples of the removal method include wet etching.

The film 63B is removed. Examples of the removal method include wet etching. As a result of the removal, an upper part of the opening 451 is formed again, and an upper surface of the block insulator 55A is exposed.

As shown in FIG. 29, topmost parts of the block insulator 55A, the charge storage film 54A, the tunnel insulator 53A, the semiconductor 51A, and the core 50A are removed. Examples of the removal method include RIE. The removal is performed until the core 50A is exposed. As a result of the removal, a block insulator 55, a charge storage film 54, a tunnel insulator 53, a semiconductor 51, and a core 50B are formed. During the process of the removal, an upper part of the insulator 45B is also removed, and the insulator 45 is formed.

As shown in FIG. 30, the topmost part of the core 50B is removed. Examples of the removal method include wet etching. Through the removal, a trench 511 is formed in the removed region, and a core 50 is formed.

As shown in FIGS. 5 and 7, a conductor 46 is deposited. Examples of the deposition method include physical vapor deposition (PVD). A conductor 47 is deposited. Examples of the deposition method include CVD.

1.3. Advantages (Advantageous Effects)

According to the first embodiment, it is possible to provide a memory device with a small variation in electric characteristics, as will be described below.

A structure of a reference example for comparison similar to the first structure 100 could be manufactured in the following manner. That is, in a process corresponding to the process described above with reference to FIG. 8, an insulator 45A is formed on an upper surface of the substrate 71. On an upper surface of the insulator 45A, a layer stack of insulators 43, SM1, 41, SM2, 39, and 36 is formed. Through the same process as the process described above with reference to FIG. 15, a memory hole LMH is formed. The insulator 45A and the insulators 43, SM4, 41, SM3, 39, and 36 include the same material (silicon), and therefore an etching selectivity between the insulator 45A and the insulators 43, SM4, 41, SM3, 39, and 36 is small. Accordingly, through the etching, the upper surface of the substrate 71 is removed, and a trench is formed in the substrate 71 below the memory hole LMH. Generally, etching inevitably advances at different speeds according to the location, thereby causing a variation in the depth of the trench. In particular, the position of the bottom of the trench varies more greatly as the depth of the trench becomes larger as in the memory hole LMH. Subsequently, the trench is filled in by a semiconductor such as silicon through epitaxial growth. Depending on the variation in the depth of the trench, the height of the upper surface of the semiconductor varies.

Subsequently, a memory pillar is formed by a process similar to the process of FIG. 16 and the process subsequent thereto, on the upper surface of the semiconductor. Since the memory pillar is positioned on the upper surface of the semiconductor, the position at the bottom of the memory pillar varies.

Subsequently, through a process similar to the process described above with reference to FIGS. 28 to 30, a trench 511 is formed in the topmost part of the core 50. At this time, since the position of the bottom of the memory pillar varies as described above, the depth of the trench 511 varies. The depth of the trench 511 affects the area of a surface at which the set of the conductors 46 and 47 contact the semiconductor 51, and the contact area varies according to the variation in the trench depth. This leads to a variation in electric characteristics of the memory pillar.

According to the first embodiment, the spacer films 63 and 64 are provided. The spacer film 63 remains as a film 63B during the process described with reference to FIG. 11, and the film 63B is formed by etch-back of the film 63A. A height of a portion to be removed from the upper surface of the film 63A is very small, therefore making the variation in the height of the film 63B small. The spacer film 64 is, during the process of etching for forming the memory hole LMH, positioned as a film 64B at the bottom of a region in which the memory hole LMH is to be formed. Since the film 64B is positioned on an upper surface of the film 63B with a small variation in height, the variation in the height of the lower surface of the film 64B is small. Since the material of the film 64B differs from the materials of the insulators 43, SM4, 41, SM3, 39, and 36, the film 64B functions as a stopper for etching of the insulators 43, SM4, 41, SM3, 39, and 36, with the upper surface of the film 63B not scraped, thus maintaining the small variation in the height of the film 63B. Thus, a variation in the height of the upper surface of the core 50B exposed by etching in the process described above with reference to FIGS. 28 and 29 is small. Accordingly, a variation in the depth of the trench 511 formed in the process described above with reference to FIG. 30 is small. Therefore, a variation in contact area between the set of the conductors 46 and 47 and the semiconductor 51 is small. This suppresses a variation in electric characteristics of the memory pillar MP. It is thereby possible to provide a memory device 1 with a small variation in electric characteristics.

2. Second Embodiment

A second embodiment is based on the first embodiment but differs from the first embodiment in terms of the structure of a memory pillar.

FIG. 31 schematically shows an example of a cross-sectional structure of a part of a memory device according to a second embodiment. FIG. 32 is an enlarged view of a part of FIG. 31, showing a cross-sectional structure of a part of the memory device according to the second embodiment. In the description with reference to FIGS. 31 and 32, the "Z direction" indicates the upward direction, the "−Z direction" indicates the downward direction, the "Y direction" indicates the right direction, and the "−Y direction" indicates the left direction.

A memory pillar UMPb of a memory device 1*b* according to the second embodiment includes a first portion UMPb1 and a second portion UMPb2. A lower surface of the first portion UMPb1 is in contact with an upper surface of the second portion UMPb2. Each of the first portion UMPb1 and the second portion UMPb2 has an XY area, which decreases from a lower surface to an upper surface. An XY area of the lower surface of the first portion UMPb1 is greater than an XY area of the upper surface of the second portion UMPb2. Thus, a side surface of the first portion UMPb1 is deviated from, and is therefore not aligned with, an extended line from a side surface of the second portion UMPb2. An XY area of the lower surface of the memory pillar LMP is greater than an XY area of the upper surface of the first portion UMPb1. Thus, a side surface of the memory pillar LMP is deviated from, and is therefore not aligned with, an extended line from a side surface of the first portion UMPb1. Accordingly, the XY area of the memory pillar MP continuously changes in accordance with a change in position on the Z axis toward the Z direction, but discontinuously changes at a boundary between the first portion UMPb1 and the second portion UMPb2, and at a boundary between the side surface of the LMP and the first portion UMPb1. The deviation between the side surface of the first portion UMPb1 and the extended line from the side surface of the second portion UMPb2 and the deviation between the side surface of the memory pillar LMP and the extended line from the side surface of the first portion UMPb1 occurs not only in the XZ cross section as shown in FIG. 31, but also occurs in other cross sections including the Z axis.

In the process described above with reference to FIG. 22 in the first embodiment, the center of the memory hole UMH and the center of the memory hole LMH inevitably deviate due to the inevitable deviation in position of the mask in a photolithography process for forming an opening in the mask 77. Accordingly, in actuality, a central line CLL of the memory pillar LMP and a central line CLU of the memory pillar UMPb (UMPb1 and UMpb2) are deviated from each other, as shown in FIG. 32. The deviation between the central line CLL of the memory pillar LMP and the central line CLU of the memory pillar UMP similarly apply to the first embodiment.

Side surfaces of the core 50*b*, the semiconductor 51*b*, and the layer stack 52*b* extend along a side surface of the memory pillar MPb.

FIG. 33 shows a cross-sectional structure during manufacturing of the memory device according to the second embodiment. FIG. 31 shows a first structure 100 in the region shown in FIG. 31. FIG. 33 shows a structure during a process subsequent to the process described above with reference to FIG. 22 of the first embodiment. In the description with reference to FIG. 33, the terms "above", "upper", "top" etc. indicate the −Z direction, and the terms "below", "lower", "bottom" etc. indicate the Z direction.

For manufacturing of the memory device 1*b*, first, the process described above with reference to FIGS. 8 to 22 is performed. Thereafter, as shown in FIG. 33, a spacer film 79 is deposited. Examples of the deposition method include CVD. In one example, the spacer film 79 contains silicon oxide and/or carbon. The spacer film 79 covers an upper surface of the insulator 30, and a side surface of an upper part of the memory hole UMH. The insulators SM2 and 34 are exposed at a lower part of the memory hole UMH.

The insulators SM2 and 34 are partially removed at the lower part of the memory hole UMH. Examples of the removal method include wet etching. Through the removal, an XY area of a region not covered by the spacer film 79 increases at the lower part of the memory hole UMH. Thereby, a region is formed in which a first portion UMPb1 of a memory pillar UMPb is to be formed.

After the process described with reference to FIG. 33, the process described above with reference to FIGS. 23 to 29 of the first embodiment is performed. Thereby, the structure shown in FIG. 31 is obtained.

According to the second embodiment, the following advantages are obtained, in addition to the same advantages as those of the first embodiment.

For an increase in capacity of the memory device, the memory pillar MP is very long along the Z direction. Accordingly, a difference between an XY area of a lower part and an XY area of an upper part of the each of the memory holes UMH and LMH formed by anisotropic etching is large. This leads to a great variation in characteristics of the memory cell transistors, depending on the layer in which the memory cell transistors are positioned. Accordingly, it is preferable that a variation in each layer of the XY area of the memory hole be small. For that purpose, after the process described above with reference to FIG. 22, the XY area of the bottommost part of the memory hole UMH can be enlarged. During the enlargement of the XY area, if the film 61B in the memory hole LMH is exposed at the bottom of the upper memory hole UMH, the film 61B is removed, and then the lower memory hole LMH at the lower part is also enlarged. This unintentionally increases the difference in the XY area over the entire memory pillar MP.

According to the second embodiment, the spacer film 62 is provided. The spacer film 62 remains as a film 62B during the process described above with reference to FIG. 32, and the film 62B covers an upper surface of the film 61B. Accordingly, during the enlargement of the width of the memory hole UMH, the film 61B is removed, thereby preventing an unintentional increase of the XY area of the memory hole LMH. It is thereby possible to provide a memory device 1*b* with a small variation in electric characteristics.

3. Modifications

The memory pillar MP may include three or more joined portions. In this case, spacer films 61 and 62 are provided at the boundary between two joined portions, and films 61A and 62A to be formed into the spacer films 61 and 62 are provided during the manufacturing process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:

a plurality of first conductors;

a plurality of first insulators, the first conductors and the first insulators being arranged one by one in an alternating manner in a first direction in a first region;

a plurality of second insulators, the first insulators and the second insulators being arranged one by one in an alternating manner in the first direction in a second region;

a memory pillar penetrating the first conductors and the first insulators in the first region, the memory pillar including a semiconductor and a film surrounding a side surface of the semiconductor;

a second conductor including a first portion, a second portion, and a third portion, the second portion electrically coupling the first portion and the third portion, a side surface of the third portion being electrically coupled to the semiconductor;

a first film extending along the first direction in the second region and having an angle with respect to the first direction; and a second film contacting the first film, extending along the first direction, having an angle with respect to the first direction, and including carbon or metal, wherein at least one of the second insulators includes a portion extending along the first film and the second film in the second region and being distanced from the second film.

2. The device according to claim 1, further comprising:

a third film extending along the first direction in the second region and having an angle with respect to the first direction; and a fourth film contacting the third film, extending along the first direction, having an angle with respect to the first direction, and including carbon or metal, wherein the first film contacts a side surface of the second film on a side of a second direction, and a set of the first film and the second film is positioned closer to the second direction than a set of the third film and the fourth film.

3. The device according to claim 2, wherein the set of the first film and the second film is aligned with the set of the third film and the fourth film along the second direction.

4. The device according to claim 3, wherein an interval between an upper end of the second film and an upper end of the fourth film is smaller than an interval between a lower end of the second film and a lower end of the fourth film.

5. The device according to claim 2, further comprising:

a fifth film extending along the first direction in the second region; and a sixth film extending along the first direction and contacting the fifth film, wherein the first film and the second film are positioned closer to the first direction than the fifth and the sixth films and, at least one of the second insulators includes a portion extending along the fifth and the sixth films in the second region.

6. The device according to claim 5, further comprising:

a seventh film extending along the first direction in the second region; and an eighth film extending along the first direction and contacting a side surface of the seventh film on a side of the second direction, wherein the fifth film contacts a side surface of the sixth film on a side of the second direction, and a set of the fifth film and the sixth film is positioned closer to the second direction than a set of the seventh film and the eighth film.

7. The device according to claim 6, wherein the set of the fifth film and the sixth film is aligned with the set of the seventh film and the eighth film along the second direction.

8. The device according to claim 6, wherein a material of the first film, a material of the second film, a material of the third film, a material of the fourth film, a material of the fifth film, a material of the sixth film, a material of the seventh film, and a material of the eighth film differ from a material of the first insulators and a material of the second insulators.

9. The device according to claim 6, wherein the first film, the third film, the fifth film, and the seventh film include silicon, the second film, the fourth film, the sixth film, and the eighth film include carbon or metal, the first insulators include silicon oxide, and the second insulators include silicon nitride.

10. The device according to claim 5, wherein the memory pillar includes a fourth portion and a fifth portion, the fifth portion being coupled to the fourth portion at a position closer to the first direction than the fourth portion, an area of a section of the memory pillar intersecting the first direction changes toward the first direction, and discontinuously changes at a boundary between the fourth portion and the fifth portion, and the fifth film and the sixth film are aligned with the boundary along the second direction.

11. The device according to claim 5, wherein the memory pillar includes a fourth portion, a fifth portion, and a sixth portion, the fifth portion being coupled to the fourth portion at a position closer to the first direction than the fourth portion, the sixth portion being coupled to the fifth portion at a position closer to the first direction than the fifth portion, and an area of a section of the memory pillar intersecting the first direction changes toward the first direction, and discontinuously changes at a boundary between the fourth portion and the fifth portion and at a boundary between the fifth portion and the sixth portion.

12. The device according to claim 1, wherein a material of the first film and a material of the second film differ from a material of the first insulators and a material of the second insulators.

13. The device according to claim 1, wherein the first film includes silicon, the second film includes carbon or metal, the first insulators include silicon oxide, and the second insulators include silicon nitride.

14. A method of manufacturing a semiconductor memory device, comprising:

forming a first insulator including a first opening;

forming a first film in a part of the first opening;

forming a second film in a part of the first opening on a side of a first direction;

forming a first hole that penetrates a plurality of third insulators and a plurality of fourth insulators and reaches the second film, the third insulators and the fourth insulators being formed on the first insulator and the second film and arranged one by one in an alternating manner in the first direction;

removing the second film to form a first space;

forming a second hole that penetrates a plurality of fifth insulators and a plurality of sixth insulators and reaches the first hole, the fifth insulators and the sixth insulators being formed on a side of the first direction of the third and fourth insulators and arranged one by one in an alternating manner in the first direction;

forming a layer stack including a semiconductor in the first hole, the first space, and the second hole;

exposing a first surface on a side of a second direction opposite to the first direction of the layer stack;

exposing a side surface of the semiconductor; and forming a first conductor contacting the exposed side surface of the semiconductor.

15. The method according to claim 14, wherein the exposing of the first surface in the second direction of the layer stack includes removing the first film from a side of the second direction.

16. The method according to claim 15, wherein the layer stack further includes a seventh insulator covered by the semiconductor, and the exposing of the side surface of the semiconductor includes:

partially removing the layer stack from a side of the second direction; and removing a portion of the seventh insulator on a side of the second direction toward the first direction.

17. The method according to claim 16, further comprising:

after the forming of the first space and before the forming of the layer stack, forming an eighth insulator in the first hole and a first portion in the first space; and forming a third film on the eighth insulator, wherein the forming of the second hole includes:

removing the third film; and removing the eighth insulator.

18. The method according to claim 17, further comprising:

enlarging a part of the second hole after the forming of the third film and before the removing of the third film.

19. The method according to claim 18, wherein the enlarging of the part of the second hole includes:

covering, with a fourth film, a part of a side surface of the second hole on a side of the second direction; and partially removing a part of the side surface of the second hole not covered by the fourth film in a direction that enlarges the second hole.

20. The method according to claim 15, further comprising:

replacing each of the fourth insulators and the sixth insulators with a second conductor.

* * * * *